US012652943B2

(12) United States Patent
Moon et al.

(10) Patent No.: US 12,652,943 B2
(45) Date of Patent: Jun. 9, 2026

(54) DISPLAY DEVICE WITH AN ORGANIC LIGHT-EMITTING LAYER AND A COMPONENT, AND APPARATUS AND METHOD OF MANUFACTURING THE DISPLAY DEVICE

(71) Applicant: Samsung Display Co., Ltd., Yongin-si (KR)

(72) Inventors: Changyun Moon, Yongin-si (KR); Gihyun Lee, Yongin-si (KR); Ilseob Yoon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 720 days.

(21) Appl. No.: 17/941,659

(22) Filed: Sep. 9, 2022

(65) Prior Publication Data

US 2023/0075636 A1 Mar. 9, 2023

(30) Foreign Application Priority Data

Sep. 9, 2021 (KR) ........................ 10-2021-0120537

(51) Int. Cl.
 *H10K 71/20* (2023.01)
 *H10K 59/12* (2023.01)
 *H10K 59/88* (2023.01)
 *H10K 71/00* (2023.01)
(52) U.S. Cl.
 CPC ............. *H10K 71/20* (2023.02); *H10K 59/88* (2023.02); *H10K 71/00* (2023.02); *H10K 59/1201* (2023.02)

(58) Field of Classification Search
 CPC ........ H10K 71/20; H10K 59/88; H10K 71/00; H10K 59/1201; H10K 59/12; H10K 59/65; H10K 71/80
 See application file for complete search history.

(56) References Cited

U.S. PATENT DOCUMENTS

| | | | | |
|---|---|---|---|---|
| 7,825,584 B2 * | 11/2010 | Kim | ..................... | H10K 59/352 |
| | | | | 313/506 |
| 9,166,191 B2 | 10/2015 | Yoon | | |
| 9,865,817 B2 | 1/2018 | Kawanago et al. | | |
| 10,068,525 B2 * | 9/2018 | Shin | ..................... | H10K 59/805 |
| 10,418,431 B2 * | 9/2019 | Park | ................... | H10K 59/1213 |
| 11,417,717 B2 * | 8/2022 | Lee | ..................... | H10K 59/123 |
| 11,805,678 B2 * | 10/2023 | Kim | ..................... | H10K 59/121 |
| 11,899,862 B2 | 2/2024 | Bok et al. | | |
| 2004/0140758 A1 * | 7/2004 | Raychaudhuri | ........ | H10K 50/17 |
| | | | | 313/504 |

(Continued)

FOREIGN PATENT DOCUMENTS

| | | |
|---|---|---|
| JP | 4340459 | 10/2009 |
| JP | 6517643 | 5/2019 |

(Continued)

*Primary Examiner* — Caleb E Henry
(74) *Attorney, Agent, or Firm* — Lerner David LLP

(57) ABSTRACT

An apparatus for manufacturing a display device includes a chamber in which a display substrate is arranged, a lamp portion arranged outside or inside the chamber irradiating light, and a mask arranged inside the chamber to expose a portion of the display substrate and to shield another portion of the display substrate. The mast includes a hole through which the light irradiated from the lamp portion passes, and the lamp portion includes a flash lamp or a xenon lamp.

6 Claims, 24 Drawing Sheets

10

(56) References Cited

U.S. PATENT DOCUMENTS

| | | | | |
|---|---|---|---|---|
| 2007/0007515 | A1* | 1/2007 | Suh | H10K 59/123 |
| | | | | 257/40 |
| 2007/0162074 | A1* | 7/2007 | Bartlett | A61B 17/0401 |
| | | | | 606/232 |
| 2008/0174709 | A1* | 7/2008 | Lim | H10D 86/441 |
| | | | | 445/47 |
| 2009/0130609 | A1 | 5/2009 | Irving et al. | |
| 2010/0085532 | A1 | 4/2010 | Hwang et al. | |
| 2011/0109612 | A1* | 5/2011 | Chaji | G09G 5/18 |
| | | | | 345/211 |
| 2012/0012834 | A1* | 1/2012 | Sonoda | H10K 59/173 |
| | | | | 257/40 |
| 2015/0102316 | A1* | 4/2015 | Park | H10K 59/122 |
| | | | | 257/40 |
| 2015/0311265 | A1* | 10/2015 | Matsueda | H10K 59/35 |
| | | | | 257/89 |
| 2015/0364530 | A1* | 12/2015 | Yoon | H10K 59/121 |
| | | | | 257/40 |
| 2016/0032441 | A1* | 2/2016 | Lee | H01J 37/32743 |
| | | | | 216/13 |
| 2016/0093679 | A1* | 3/2016 | Moon | H10K 59/122 |
| | | | | 257/40 |
| 2016/0329387 | A1* | 11/2016 | Mohanan | H10K 50/11 |
| 2017/0062535 | A1* | 3/2017 | Kim | H10K 59/80524 |
| 2017/0069871 | A1* | 3/2017 | Yim | H10K 50/15 |
| 2017/0084635 | A1* | 3/2017 | Jung | H10D 30/6731 |
| 2017/0179441 | A1* | 6/2017 | Lee | H10K 59/1201 |
| 2018/0108677 | A1* | 4/2018 | Yeh | H10D 86/441 |
| 2019/0205596 | A1* | 7/2019 | Kim | H10K 50/80 |
| 2020/0035766 | A1* | 1/2020 | Moon | H10K 59/122 |
| 2020/0058906 | A1* | 2/2020 | Kim | C23C 14/042 |
| 2020/0091259 | A1* | 3/2020 | Han | H10K 59/124 |
| 2020/0119106 | A1* | 4/2020 | Kim | H10K 59/353 |
| 2020/0194513 | A1* | 6/2020 | Kim | H10K 59/122 |
| 2020/0194515 | A1 | 6/2020 | Hwang et al. | |
| 2020/0227488 | A1* | 7/2020 | Xin | H10K 59/1213 |
| 2020/0251539 | A1* | 8/2020 | Fu | H10K 59/352 |
| 2021/0159281 | A1* | 5/2021 | Kim | H10K 59/122 |
| 2021/0265396 | A1 | 8/2021 | Kim et al. | |

FOREIGN PATENT DOCUMENTS

| | | |
|---|---|---|
| KR | 10-0729089 | 6/2007 |
| KR | 20140067528 A | 6/2014 |
| KR | 20180138110 A | 12/2018 |
| KR | 10-2020-0074600 | 6/2020 |
| KR | 20210082316 A | 7/2021 |
| KR | 20210106616 A | 8/2021 |

* cited by examiner

FIG. 6

DISPLAY DEVICE WITH AN ORGANIC LIGHT-EMITTING LAYER AND A COMPONENT, AND APPARATUS AND METHOD OF MANUFACTURING THE DISPLAY DEVICE

CROSS-REFERENCE TO RELATED APPLICATION(S)

This application claims priority to and benefits of Korean Patent Application No. 10-2021-0120537 under 35 U.S.C. § 119, filed in the Korean Intellectual Property Office (KIPO) on Sep. 9, 2021, the entire contents of which are incorporated herein by reference.

BACKGROUND

1. Technical Field

One or more embodiments relate to a display device without a defect in an organic light-emitting element, and an apparatus and method of manufacturing the display device, which are capable of minimizing damage in the organic light-emitting element.

2. Description of the Related Art

Electronic devices based on mobility are widely used. As mobile electronic devices, tablet personal computers (PCs) have been broadly used recently, in addition to small electronic devices, such as mobile phones.

Such mobile electronic devices include display devices that support various functions in order to provide a user with visual information such as an image or a video. Recently, with the miniaturization of various components for driving a display device, the importance of the display device in an electronic device has continually increased, and a structure to bend a flat display device by a certain angle has been developed.

Also, the display device as described above may include a portion from which some layers are removed, so that components are arranged therein. In this case, various apparatuses and methods have been developed to remove some layers.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

In general, laser is widely used to remove at least one layer arranged in an area of a display device. However, in this case, an organic light emitting element of the display device may be damaged due to a high energy of the laser. In order to solve such a problem, one or more embodiments of the disclosure provide a display device capable of minimizing damage to an organic light-emitting element, and an apparatus and method of manufacturing the display device.

Additional aspects will be set forth in part in the description which follows and, in part, will be apparent from the description, or may be learned by practice of the presented embodiments of the disclosure.

According to one or more embodiments, an apparatus for manufacturing a display device includes a chamber in which a display substrate is arranged, a lamp portion arranged outside or inside the chamber and irradiating light, and a mask arranged inside the chamber to expose a portion of the display substrate and to shield another portion of the display substrate. The mask may include a hole through which the light irradiated from the lamp portion passes, and the lamp portion may include a flash lamp or a xenon lamp.

According to the embodiment, the apparatus may further include a pressure controller connected to the chamber.

According to the embodiment, the apparatus may further include a transmission window through which the light from the lamp portion arranged on the outside passes. The transmission window may be arranged in the chamber.

According to one or more embodiments, a method of manufacturing a display device includes arranging, on a substrate, a display substrate including an opposite electrode and a weak adhesion layer adjacent to the opposite electrode, arranging a mask to face the display substrate, and irradiating light to a weak adhesion layer of the display substrate to remove the weak adhesion layer from the display substrate. The mask may include a hole corresponding to the weak adhesion layer, and the light may be irradiated to the weak adhesion layer, and the light may be irradiated to the substrate from below the substrate.

According to the embodiment, the method may further include forming a functional layer under or above the weak adhesion layer, and removing a portion of the functional layer corresponding to the weak adhesion layer.

According to the embodiment, the substrate may be arranged inside a chamber, and the light may be provided by a lamp portion arranged inside or outside the chamber.

According to the embodiment, a portion of the chamber on a path through which the light from the lamp portion arranged outside the chamber travels may be transparent.

According to one or more embodiments, a method of manufacturing a display device includes arranging a weak adhesion layer on a substrate of the display device in a transmission area of the display device, the transmission area being arranged inside to second display area of the display device; arranging an opposite electrode on the substrate of the display device in a first display area of the display device, the second display area, the transmission area, and on the weak adhesion layer, and irradiating light to the weak adhesion layer to remove the weak adhesion layer. The display device may include a pixel circuit arranged in the first display area, and a component arranged in the transmission area.

According to the embodiment, the method may further include forming a functional layer on the substrate. The light may be emitted from a flash lamp or a xenon lamp.

According to the embodiment, the flash lamp or the xenon lamp may be arranged inside or outside a chamber.

According to the embodiment, the chamber may include a transmission window through which the light supplied by the flash lamp or the xenon lamp arranged outside the chamber passes.

According to the embodiment, the method may further include forming a capping layer on the opposite electrode and the weak adhesion layer.

According to the embodiment, the opposite electrode may not be arranged on the weak adhesion layer.

According to one or more embodiments, a display device includes a first display area, a second display area, a transmission area arranged inside the second display area, a pixel circuit arranged in the first display area, a pixel arranged in the first display area and electrically connected to the pixel circuit, an auxiliary pixel arranged in the second display area, electrically connected to the pixel circuit, and emitting light of a same color as the pixel, and a connection line electrically connecting the auxiliary pixel to the pixel circuit. Each of the pixel and the auxiliary pixel may include a pixel electrode, an intermediate layer arranged on the pixel electrode and including an organic light-emitting layer, an opposite electrode arranged on the intermediate layer, and a functional layer including a same organic material. The functional layer may include a first opening area corresponding to the transmission area. The opposite electrode may include a second opening area corresponding to the transmission area.

According to the embodiment, the display device may further include a component arranged in the transmission area.

However, embodiments of the disclosure are not limited to those set forth herein. The above and other embodiments will become more apparent to one of ordinary skill in the art to which the disclosure pertain by referencing the detailed description of the disclosure given below.

These general and specific embodiments may be implemented by using a system, a method, a computer program, or a combination thereof.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 6 is a schematic diagram of an equivalent circuit of a pixel arranged on a display panel, according to an embodiment;

DETAILED DESCRIPTION OF THE EMBODIMENTS

Figure 1:
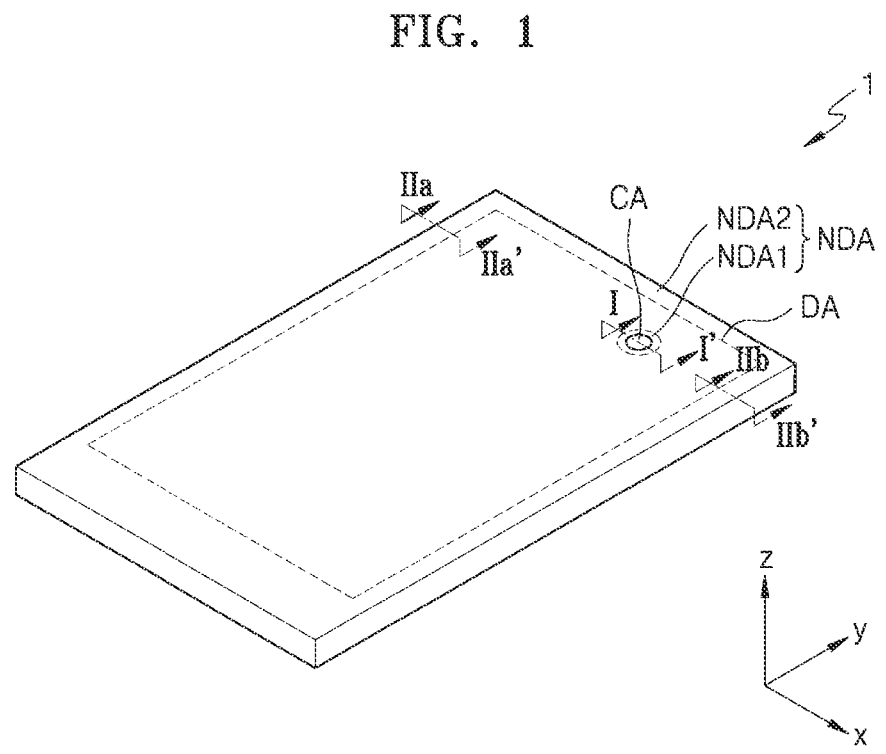
FIG. 1 is a schematic perspective view of a display device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the disclosure. As used herein, the term "and/or" includes any and all combinations of one or more of the associated listed items. The phrase "at least one of" is intended to include the meaning of "at least one selected from the group of" for the purpose of its meaning and interpretation. For example, "at least one of A and B" may be understood to mean "A, B, or A and B."

While the disclosure is capable of various modifications and alternative forms, embodiments thereof are shown by way of example in the drawings and will herein be described in detail. Effects and characteristics of the disclosure, and realizing methods thereof will become apparent by referring to the drawings and embodiments described in detail below. However, the disclosure is not limited to the embodiments disclosed hereinafter and may be realized in various forms.

Hereinafter, embodiments of the disclosure will be described in detail by referring to the accompanying drawings. In descriptions with reference to the drawings, the same reference numerals are given to elements that are the same or substantially the same and descriptions will not be repeated.

It will be understood that although the terms "first," "second," and the like may be used herein to describe various elements, these elements should not be limited by these terms. These elements are only used to distinguish one element from another.

As used herein, the singular expressions "a," "an," and "the" are intended to include the plural forms (or meanings) as well, unless the context clearly indicates otherwise.

It will be further understood that the terms "comprise," "include," and/or "have" and variations thereof used herein specify the presence of stated features or elements, but do not preclude the presence or addition of one or more other features or elements.

It will be understood that when a layer, region, or element is referred to as being formed "on" another layer, area, or element, it can be directly or indirectly formed on the other layer, region, or element. That is, for example, intervening layers, regions, or elements may be present.

Sizes of elements in the drawings may be exaggerated for convenience of explanation. For example, sizes and thicknesses of the elements in the drawings are randomly indicated for convenience of explanation, and thus, the disclosure is not necessarily limited to the illustrations of the drawings.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

When an embodiment may be implemented differently, a specific process order may be performed differently from the described order. For example, two consecutively described processes may be performed substantially at the same time or performed in an order opposite to the described order.

FIG. 1 is a schematic perspective view of a display device according to an embodiment.

Referring to FIG. 1, the display device 1 may include a display area DA that emits light and a non-display area NDA that does not emit light. The display device 1 may output an image by using light emitted from pixels PX (e.g., refer to FIG. 4) arranged in the display area DA.

The display device 1 may include a component area CA. The component area CA may be at least partially surrounded by the display area DA. For example, as illustrated in FIG. 1, the component area CA may be entirely surrounded by the display area DA.

Figure 4:
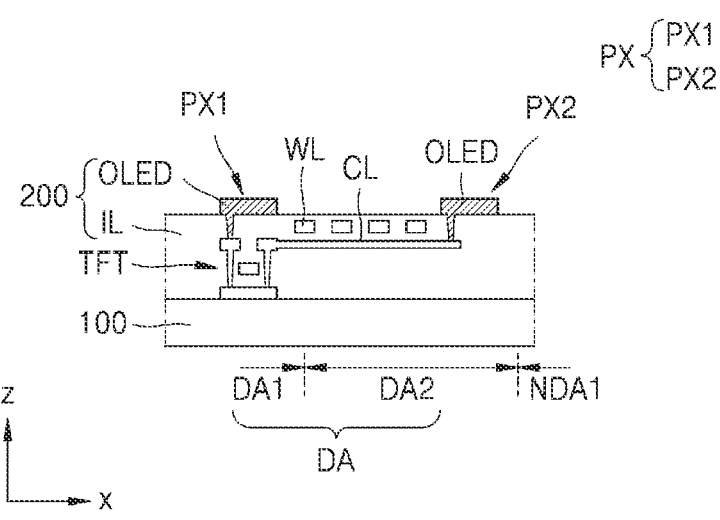
FIG. 4 is a schematic cross-sectional view of a portion of a display device, according to embodiments.

The non-display area NDA may include a first non-display area NDA1 surrounding the component area CA and a second non-display area NDA2 surrounding the display area DA. For example, the second non-display area NDA2 may surround the outside of the display area DA. For example, the first non-display area NDA1 may entirely surround the component area CA, the display area DA may entirely surround the first non-display area NDA1, and the second non-display area NDA2 may entirely surround the display area DA. In another embodiment, as illustrated in FIG. 4, the display area DA may include a first display area DA1 and a separate second display area DA2 disposed between the component area CA and the first non-display area NDA1. The second display area DA2 may be disposed between the first display area DA1 and the component area CA, and may cause the boundary of the first display area DA1 not to be visible. A separate auxiliary pixel PX2 (e.g., refer to FIG. 4) may be arranged in the second display area DA2. A separate pixel circuit may not be arranged in the auxiliary pixel PX2 (e.g., refer to FIG. 4), and the auxiliary pixel PX2 (e.g., refer to FIG. 4) may be electrically connected to a pixel circuit PC (e.g., refer to FIG. 6) of a pixel PX1 (e.g., refer to FIG. 4) adjacent to the auxiliary pixel PX2 (e.g., refer to FIG. 4) and arranged in the first display area DM. For example, the display device 1 may not include the separate pixel circuit. The auxiliary pixel PX2 (e.g., refer to FIG. 4) may simultaneously emit light with the pixel PX1 (e.g., refer to FIG. 4) arranged in the first display area DA1 and disposed adjacent to the auxiliary pixel PX2 (e.g., refer to FIG. 4). In another embodiment, although not illustrated in the drawing, the first non-display area NDA1 may not be disposed between the second display area DA2 and the component area CA. Hereinafter, for convenience of description, a case in which the second display area DA2 is not arranged will be mainly described in detail.

A component 20 (e.g., refer to FIG. 2A) may be arranged in the component area CA. Descriptions of the component area CA are provided below with reference to FIG. 2A or the like. The component area CA may be a transmission area through which light and/or sound that is output from the component 20 (e.g., refer to FIG. 2A) to the outside. For example, the component area CA may transmit external light and/or sound travelling from the outside to the component 20 (e.g., refer to FIG. 2A). In case that the light is transmitted through the component area CA, the light transmittance may be about 50% or more, about 70% or more, about 75% or more, about 80% more, about 85% or more, or about 90% or more.

Hereinafter, the display device 1 according to the embodiment may include an organic light-emitting display device. However, the display device according to one or more embodiments is not limited thereto. In another embodiment, the display device 1 may be other display devices such as an inorganic light-emitting display device, an inorganic electroluminescent (EL) display device), a quantum dot light-emitting display device, or the like. The display device 1 may include a display element (e.g., display elements LE1 and LE2 of FIG. 12). For example, the display element of the display device 1 may include an emission layer including at least one of an organic material, an inorganic material, quantum dots, an organic material and quantum dots, an inorganic material, and quantum dots.

Although the component area CA is arranged on a side (e.g., an upper right side) of the display area DA that is rectangular in FIG. 1, one or more embodiments are not limited thereto. For example, the display area DA may have a circular shape, an elliptical shape, or a polygonal shape such as a triangular or pentagonal shape, and positions of the component area CA may be variously modified. For example, the component area CA may be arranged in an upper central portion of the display area DA based on a plane (e.g., an x-y plane) of the display area DA.

FIGS. 2A to 2D are schematic cross-sectional views of a display device according to embodiments. For example, FIGS. 2A to 2D may correspond to cross-sections of the display device taken along line I-I' of FIG. 1.

Figure 2A:
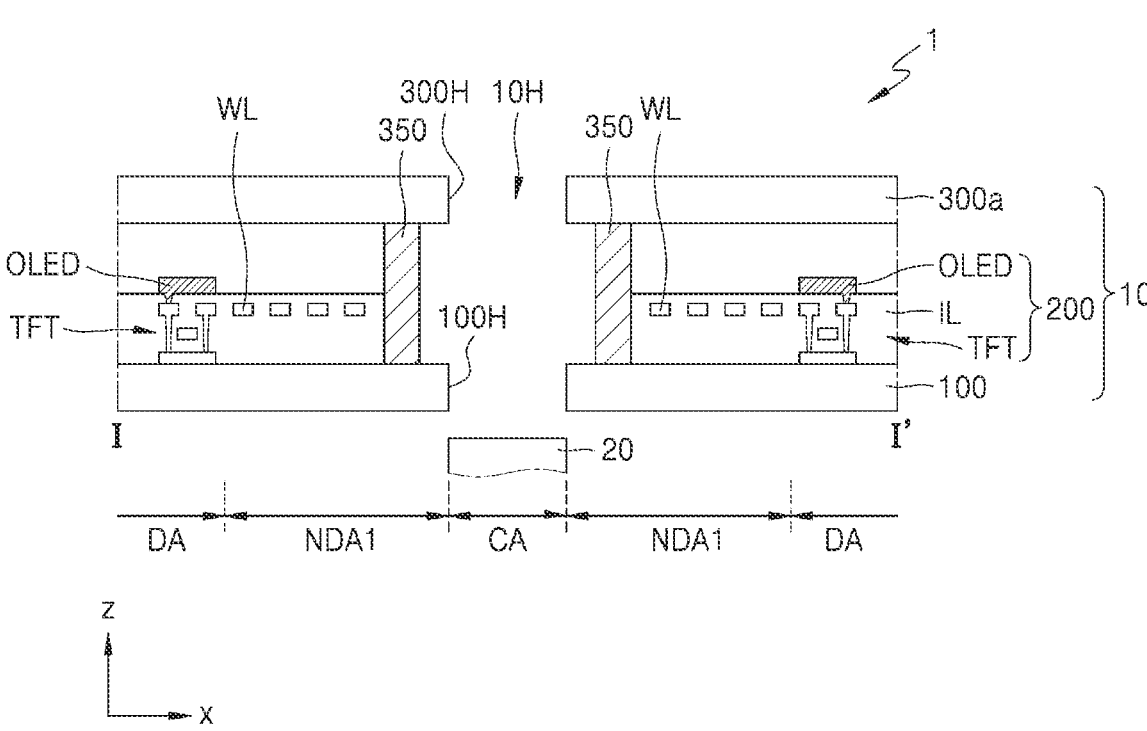
FIGS. 2A to 2D are schematic cross-sectional views of a display device according to embodiments.

Referring to FIG. 2A, the display device 1 may include a display panel 10 and a component 20. The display panel 10 may include a display element (e.g., display elements LE1 and LE2 of FIG. 12). The component 20 may correspond to the component area CA.

The display panel 10 may include a substrate 100, an encapsulation substrate 300a as an encapsulation member facing the substrate 100, and a display layer 200 disposed therebetween. For example, a sealant 350 may cover (or overlap in a plan view) side surfaces of the display layer 200 and be disposed between the substrate 100 and the encapsulation substrate 300a. Although the sealant 350 is arranged on both sides of the component area CA in FIG. 2A, the component area CA may be entirely surrounded by the sealant 350 when viewed in a direction perpendicular to a main surface of the substrate 100.

The substrate 100 may include glass or a polymer resin. The polymer resin of the substrate 100 may include at least one of polyethersulfone (PS), polyarylate (PAR), polyetherimide (PEI), polyacrylate, polyethylene naphthalate (PEN), polyethylene terephthalate, polyphenylene sulfide (PPS), polyimide (PI), polycarbonate (PC), cellulose triacetate (TAC), and cellulose acetate propionate (CAP). However, the disclosure is not limited thereto. The substrate 100 including the polymer resin may be flexible, rollable, or bendable. The substrate 100 may have a multi-layered structure including a layer including the aforementioned polymer resin and an inorganic layer (not illustrated). The encapsulation substrate 300a may include glass or the aforementioned polymer resin.

The display layer 200 may include a circuit layer PCL (e.g., refer to FIG. 10B) including a thin-film transistor TFT, an organic light-emitting diode OLED as a display element (e.g., display elements LE1 and LE2 of FIG. 12). electrically connected to the thin-film transistor TFT, and an insulating layer IL disposed therebetween. The thin-film transistor TFT and the organic light-emitting diode OLED electrically connected thereto may be arranged in the display area DA, and some wires WL disposed in the display layer 200 may be positioned in the first non-display area NDA1. The wires WL may be configured to provide a signal or voltage to pixels PX (e.g., refer to FIG. 4). The pixels PX (e.g., refer to FIG. 4) may be spaced apart from each other, and the component area CA may be disposed therebetween. Although the wires WL do not overlap the sealant 350 in the first non-display area NDA1 in FIG. 2A, in another embodiment, a portion of the sealant 350 may overlap the wires WL in a plan view. The insulating layer IL may include one or more inorganic insulating layers and/or organic insulating layers.

The display panel 10 may include a through hole 10H corresponding to the component area CA. For example, the substrate 100 and the encapsulation substrate 300a may respectively include through holes 100H and 300H corresponding to the component area CA. The display layer 200 may also include a through hole corresponding to the component area CA.

Although not illustrated in FIG. 2A, elements such as an input sensing member that senses a touch input (or touch event), an anti-reflective member, a transparent window, or the like may be further arranged on the display panel 10. The anti-reflective member may include at least one of a polarizer, a retarder, a color filter, and a black matrix.

The component 20 may be positioned in the component area CA. The component 20 may be an electronic element using light or sound. For example, the electronic element of the component 20 may include a sensor, a camera, a lamp, and a speaker. For example, the sensor of the component 20 may include an infrared sensor that emits and/or receives light, a sensor (e.g., photo sensor) that outputs and senses light, a sensor (e.g., distance sensor) that outputs sound and measures a distance, a sensor (e.g., fingerprint sensor) that recognizes a fingerprint, or the like. The camera of the component 20 may receive light and capture an image. The lamp of the component 20 may include a small lamp that outputs light. The speaker of the component may output sound. In case that the component 20 includes an electronic element using light, the electronic element may use light of various wavelength bands such as visible light, infrared light, and ultraviolet light. In case that the display panel 10 includes the through hole 10H corresponding to the component area CA as shown in FIG. 2A, the light or sound output or received from the electronic element of the component 20 may be readily utilized.

Figure 2B:
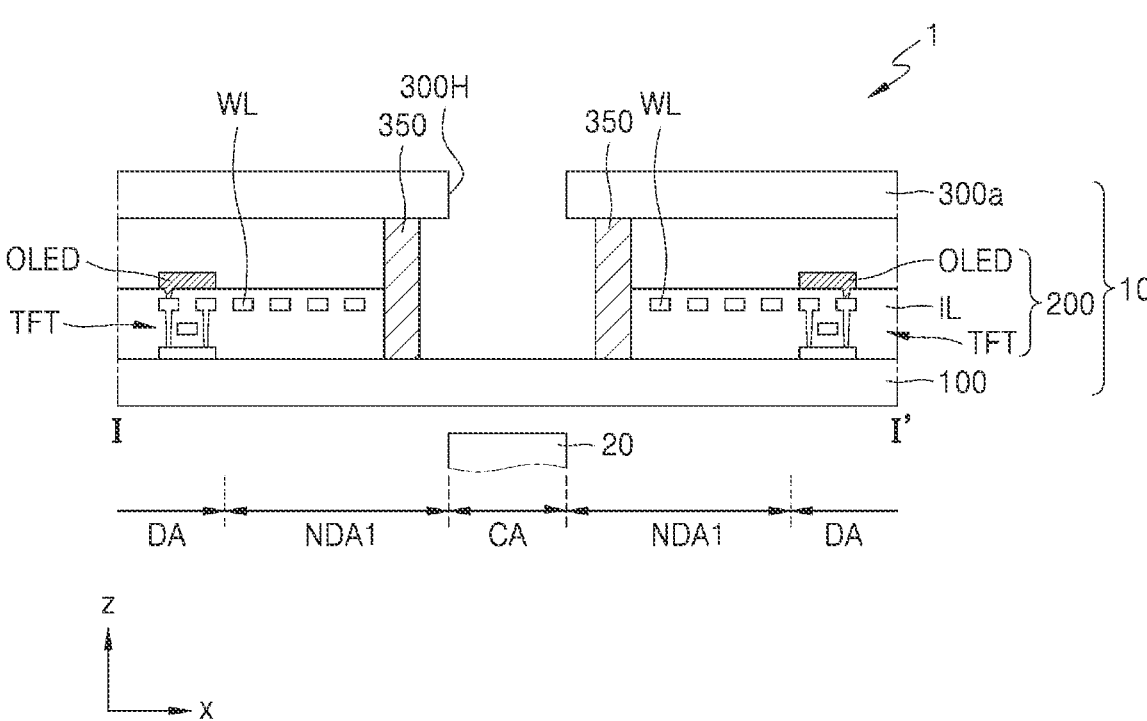
Figure 2C:
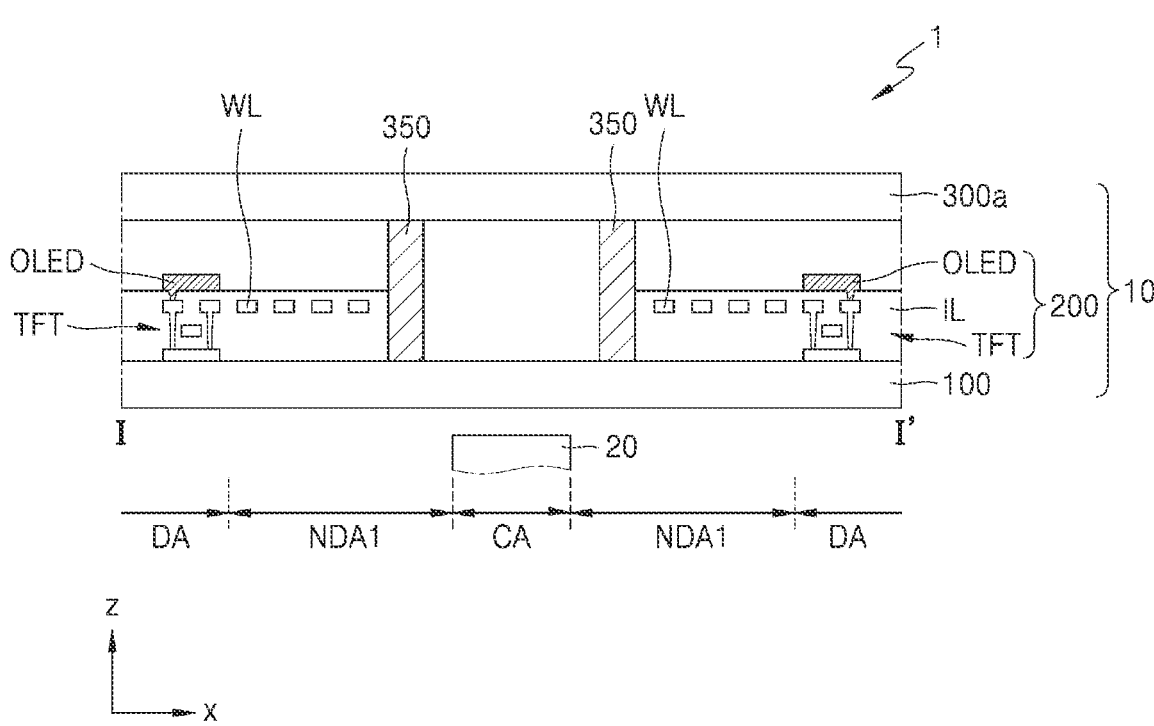
Figure 2D:
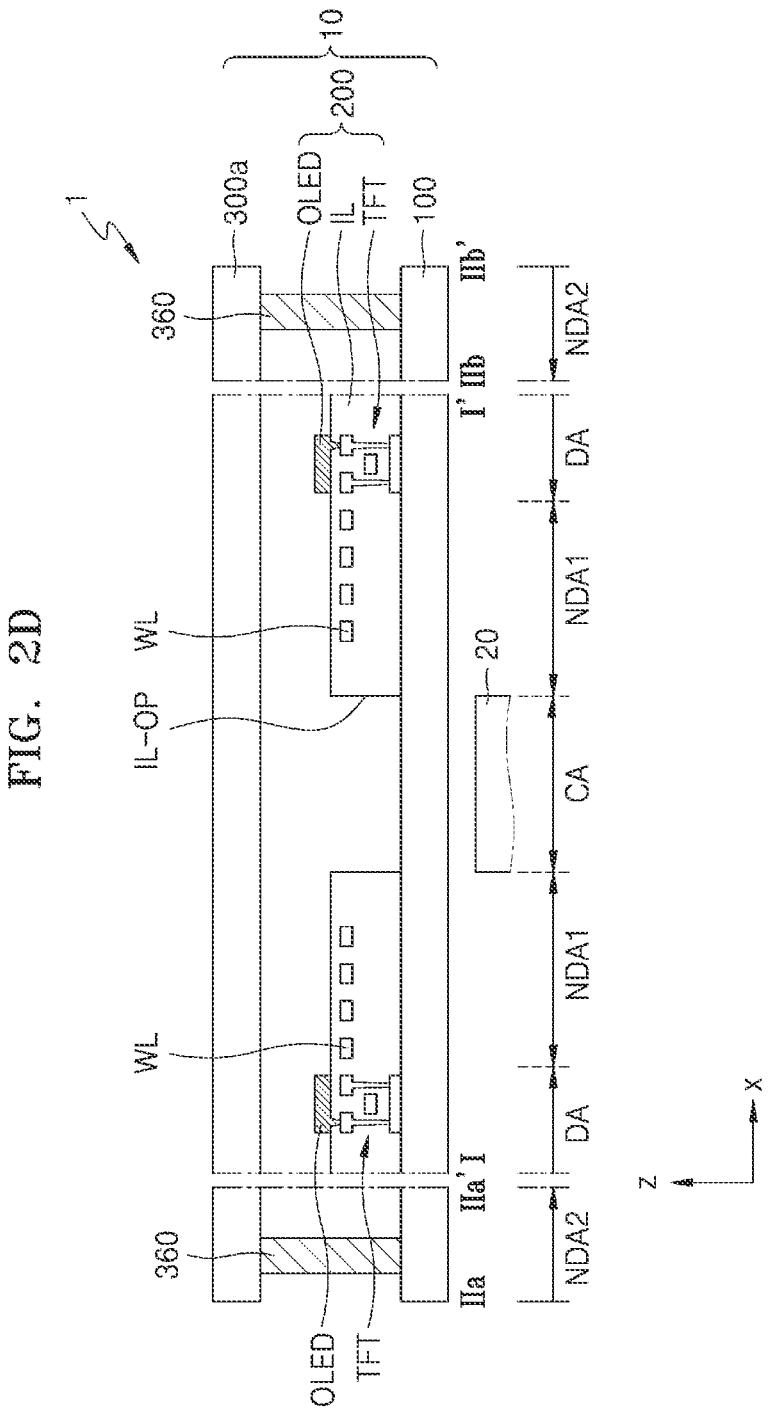

Although the display panel 10 includes the through hole 10H corresponding to the component area CA in FIG. 2A, in other embodiments, some elements (e.g., substrate 100) of the display panel 10 may not include a through hole. For example, as illustrated in FIG. 2B, the encapsulation substrate 300a may include the though hole 300H corresponding to the component area CA, but the substrate 100 may not include a through hole. As another example, as illustrated in FIG. 2C or 2D, both the substrate 100 and the encapsulation substrate 300a may not include a through hole corresponding to the component area CA. In FIG. 2C, the sealant 350 may be arranged on the first non-display area NDA1 and surround the component area CA.

The display device 1 of FIG. 2D is different from the display device 1 of FIG. 2C at least in that the sealant 350 is not included in a region (e.g., first non-display area NDA1) around the component area CA. In FIG. 2D, cross-sections of the display device 1 taken along lines IIa-IIa' and IIb-IIb' are further included. An outer sealant 360 may be positioned in the second non-display area NDA2. The outer sealant 360 may bond the substrate 100 and the encapsulation substrate 300a, and seal the display layer 200 from the outside air. Although not illustrated in FIG. 2D, the outer sealant 360 may also surround the display area DA of the display device 1 of FIGS. 2A to 2C.

An insulating layer IL of FIG. 2D may include an opening IL-OP corresponding to the component area CA. In an embodiment, no element may be arranged between the substrate 100 and the encapsulation substrate 300a corresponding to the component area CA. In another embodiment, some inorganic insulating layer(s) such as a buffer layer 111 (e.g., FIG. 10A) may partially remain in the component area CA on the substrate 100.

Although the component 20 is positioned under the display panel 10 in FIGS. 2A to 2D (e.g., disposed on side of substrate 100, in FIG. 2A), at least a portion of the component 20 may be inserted into and positioned inside the through hole 10H, and overlap side surfaces of the display panel 10 defining the through hole 10H in a plan view.

The component 20 may include members other than the aforementioned electronic elements. In an embodiment, in case that the display panel 10 is used as a smartwatch or a dashboard for a vehicle, the component 20 may be a member including clock hands or a needle indicating information (e.g., vehicle speed or the like). As another example, the component 20 may include an element such as an accessory that increases aesthetics of the display panel 10.

Figure 3A:
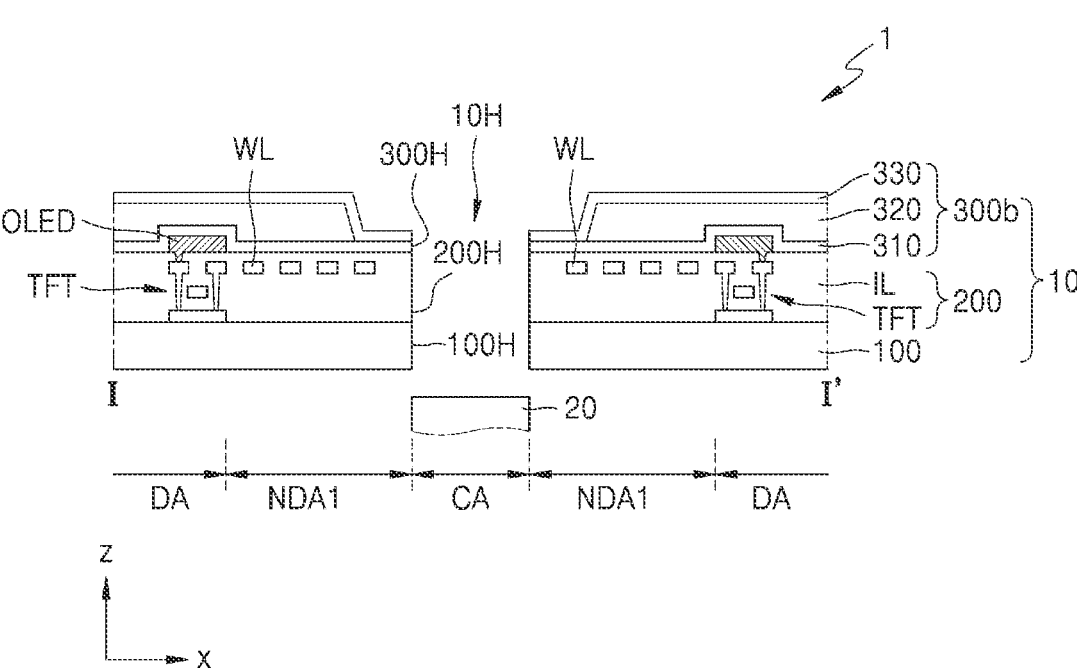
FIGS. 3A to 3C are schematic cross-sectional views of a display device according to other embodiments.
Figure 3B:
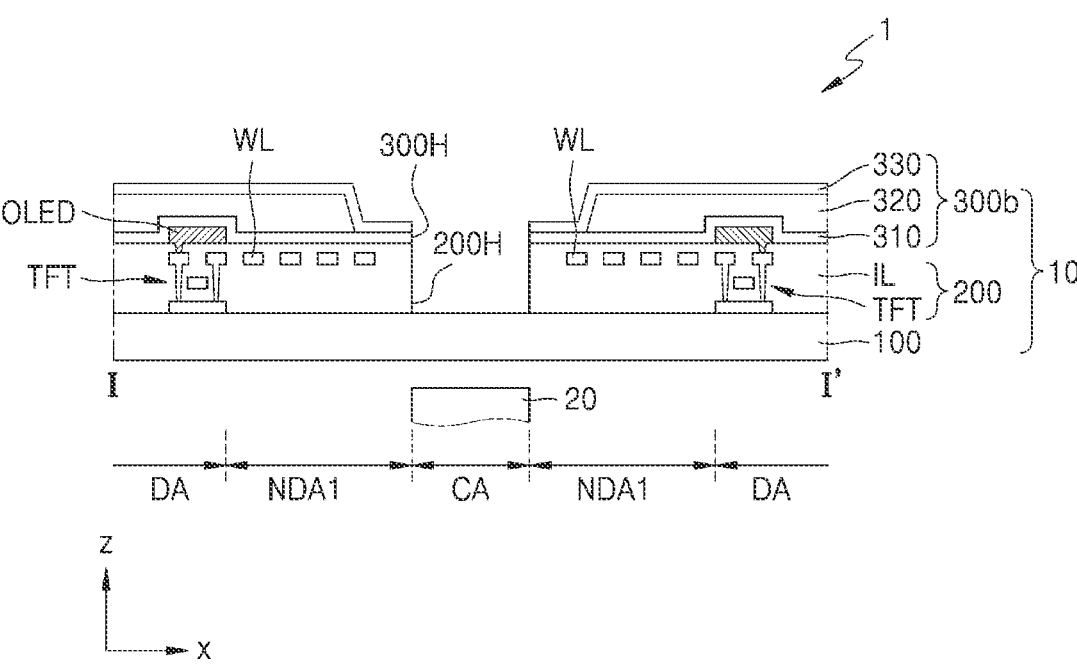
Figure 3C:
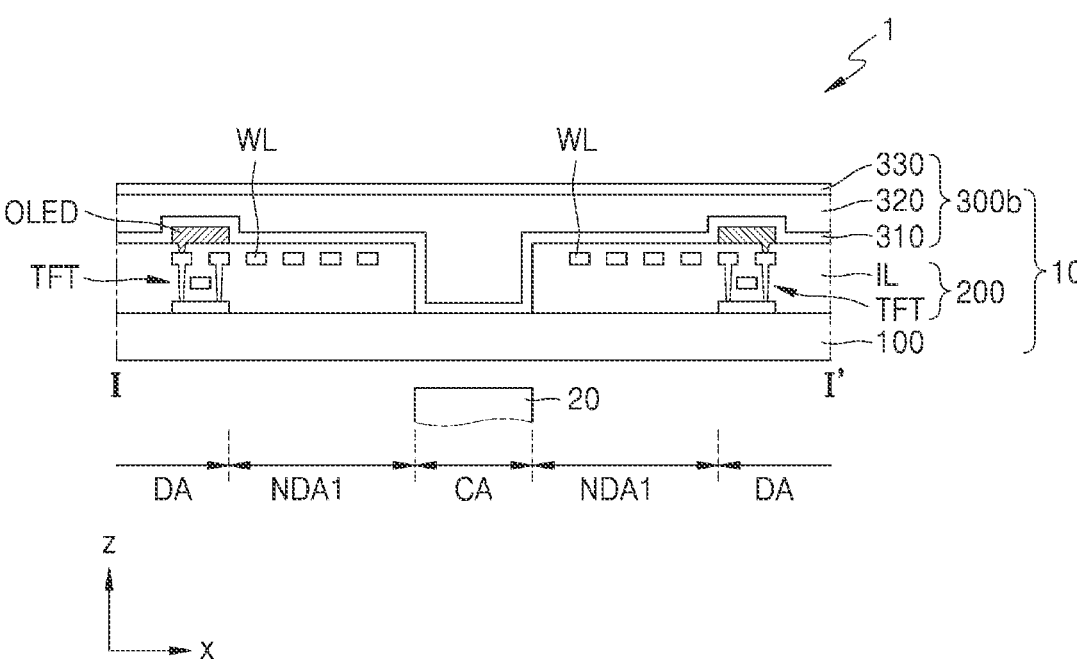

FIGS. 3A to 3C are schematic cross-sectional views of a display device according to other embodiments and may correspond to cross-sections of the display device taken along line I-I'.

The display device 1 of FIG. 3A may include a display panel 10 and a component 20 similar to the display device 1 of FIG. 2A. Although not illustrated, the display device 1 may further include an input sensing member that senses a touch input (e.g., touch event), an anti-reflective member, and a window, which are arranged on the display panel 10.

The display panel 10 of FIG. 3A is different from the display panel 10 of FIG. 2A including the encapsulation substrate 300a as an encapsulation member, and the sealant 350 at least in that the display panel 10 according to the embodiment includes a thin-film encapsulation layer 300b as an encapsulation member. In case that the display panel 10 uses the thin-film encapsulation layer 300b as an encapsulation member, the flexibility of the display panel 10 may be improved. Hereinafter, differences will be mainly described for convenience of description.

The thin-film encapsulation layer 300b may include at least one inorganic encapsulation layer and at least one organic encapsulation layer. For example, as illustrated in FIG. 3A, the thin-film encapsulation layer 300b may include a first inorganic encapsulation layer 310, a second inorganic encapsulation layer 330, and an organic encapsulation layer 320 disposed therebetween.

Each of the first and second inorganic encapsulation layers 310 and 330 may include at least one inorganic insulating materials of aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material of the organic encapsulation layer 320 may include at least one of an acryl-based resin, an epoxy-based resin, polyimide, polyethylene, etc. However, the disclosure is not limited thereto.

The display panel 10 may include a through hole 10H corresponding to a component area CA. For example, a substrate 100, a display layer 200, and the thin-film encapsulation layer 300b may include through holes 100H, 200H, and 300H corresponding to the component area CA. Each of the first inorganic encapsulation layer 310, the second inorganic encapsulation layer 330, and the organic encapsulation layer 320, which are included in the thin-film encapsulation layer 300b, may include a hole corresponding to the component area CA. A size of the hole of the organic encapsulation layer 320 may be greater than sizes of the holes of the first and second inorganic encapsulation layers 310 and 330, and the first and second inorganic encapsulation layers 310 and 330 may contact each other around the component area CA.

Although the display panel 10 of the embodiment illustrated in FIG. 3A includes the through hole 10H, in other embodiments, some elements (e.g., substrate 100) of the display panel 10 may not include a through hole. For example, as illustrated in FIG. 3B, a display layer 200 and a thin-film encapsulation layer 300b may include through holes 200H and 300H corresponding to a component area CA, but the substrate 100 may not include a through hole. In another example, as illustrated in FIG. 3C, both the substrate 100 and the thin-film encapsulation layer 300b may not include a through hole corresponding to the component area CA.

Although the substrate 100 does not include the through hole 100H (e.g., refer to FIG. 3A) as illustrated in FIGS. 3B and 3C, at least some portions of the display layer 200 corresponding to the component area CA may be removed, and light transmittance for an electronic element that is the component 20 may be secured.

In case that the thin-film encapsulation layer 300b does not include a through hole, each of at least one inorganic encapsulation layer and at least one organic encapsulation layer may cover the substrate 100 in the component area CA. For example, the display layer 200 disposed between the substrate 100 and the thin-film encapsulation layer 300b may not cover a portion of the substrate 100 corresponding to the component area CA, and the portion of the substrate 100 corresponding to the component area CA may be covered by the thin-film encapsulation layer 300b.

Although the component 20 is positioned under the display panel 10 of FIGS. 3A to 3C (e.g., on a side of substrate 100, in FIG. 3A), at least a portion of the component 20 may be inserted into and positioned inside the through hole 10H, and overlap side surfaces of the display panel 10 defining the through hole 10H in a plan view.

FIG. 4 is a schematic cross-sectional view of a portion of a display device, according to embodiments.

Referring to FIG. 4, in the display device 1, a first non-display area NDA1 and a second display area DA2 may be disposed between a component area CA and a display area DA. In this case, the display area DA, the second display area DA2, the first non-display area NDA1, and the component area CA may be sequentially arranged in a plan view. For example, the component area CA may be arranged inside the first non-display area NDA1, the first non-display area NDA1 may be arranged inside the second display area DA2, and the second display area DA2 may be arranged inside the display area DA. In the aforementioned case, the display panel 10 may be the same as or similar to that described with reference to FIGS. 2A to 3C.

The second display area DA2 as described above may reduce a visibility of a boundary between the display area DA and the first non-display area NDA1. For example, an auxiliary pixel PX2 may be arranged in the second display area DA2. The auxiliary pixel PX2 may be formed or arranged similarly to a pixel PX1 arranged in the display area DA. For example, a planar shape of the auxiliary pixel PX2 may be the same as or greater than a planar shape of the pixel PX1. The pixel PX1 may be arranged in the display area DA and emit light of the same color as the auxiliary pixel PX2. An arrangement of the auxiliary pixels PX2 may be the same as or similar to an arrangement of the pixels PX1.

The auxiliary pixel PX2 as described above may be electrically connected to a separate pixel circuit or may be electrically connected to a pixel circuit PC (e.g., refer to FIG. 6) of the pixel PX1. For example, although not illustrated in the drawing, the separate pixel circuit may be arranged under the auxiliary pixel PX2 similarly to the pixel circuit PC (e.g., refer to FIG. 6) of the pixel PX1. In another embodiment, the auxiliary pixel PX2 may share the pixel circuit PC (e.g., refer to FIG. 6 or 10A) of the pixel PX1 that is arranged in the display area DA and emits light of the same color as the auxiliary pixel PX2. In this case, a pixel electrode 121 (e.g., refer to FIG. 10A) of the auxiliary pixel PX2 may be electrically connected to the pixel circuit PC (e.g., refer to FIG. 6) of the pixel PX1 through a connection line CL. In this case, in case that the pixel PX1 emits light, the auxiliary pixel PX2 that is electrically connected to the pixel circuit PC (e.g., refer to FIG. 6) of the pixel PX1 may emit light of the same color as the pixel PX1. Accordingly, the second display area DA2 may be disposed between the display area DA and the first non-display area NDA1, and each auxiliary pixel PX2 of the second display area DA2 may also emit light in case that each pixel PX1 of the display area DA emits light. Thus, the auxiliary pixel PX2 may prevent a boundary of the display area DA from being visually recognized. For convenience of description, description of the display panel 10 without the second display area DA2 is provided below.

Figure 5:
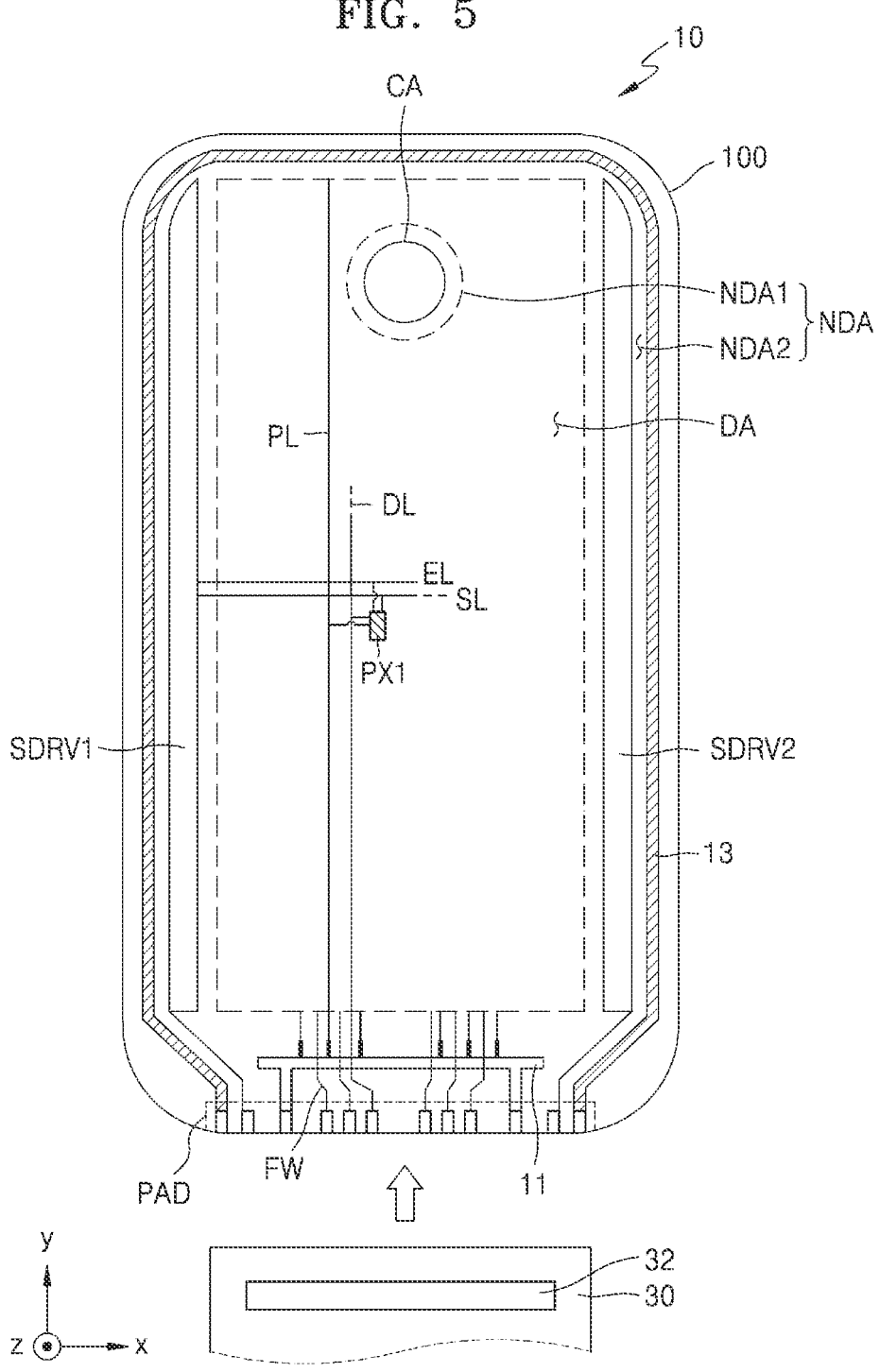
FIG. 5 is a schematic plan view of a display panel according to an embodiment.

FIG. 5 is a schematic plan view of a display panel according to an embodiment.

Referring to FIG. 5, various elements constituting the display panel 10 may be arranged on the substrate 100. For example, the substrate 100 may include a display area DA and a non-display area NDA surrounding the display area DA. The display area DA of the substrate 100 may correspond to the display area DA of the display panel 10, and the non-display area NDA of the substrate 100 may correspond to the non-display area NDA of the display panel 10.

Pixels PX1 may be arranged in the display area DA. Each of the pixels PX1 may be implemented by a display element (e.g., first display elements LE1 of FIG. 12) such as an organic light-emitting diode (OLED). Each of the pixels PX1 may emit, for example, red, green, blue, or white light.

The first non-display area NDA1 may surround the component area CA. The first non-display area NDA1 may be an area in which a display element (e.g., first or second display element LE1 or LE2 of FIG. 12) is not arranged, and signal lines configured to provide signals to the pixels PX1 provided around the component area CA may pass through the first non-display area NDA1. Pixel circuits PC (e.g., refer to FIG. 6) configured to drive the pixels PX1 may be electrically connected to outer circuits arranged in the second non-display area NDA2, respectively. A first scan driving circuit SDRV1, a second scan driving circuit SDRV2, a terminal portion PAD, a driving voltage supply line 11, and a common voltage supply line 13 may be arranged in the second non-display area NDA2.

The first scan driving circuit SDRV1 may be configured to apply a scan signal Sn to each of the pixel circuits PC (e.g., refer to FIG. 6) configured to drive the pixel PX1 through a scan line SL. The first scan driving circuit SDRV1 may be configured to apply an emission control signal En to each of the pixel circuits PC (e.g., refer to FIG. 6) through an emission control line EL. The second scan driving circuit SDRV2 may be positioned on an opposite side of the first scan driving circuit SDRV1 with respect to the display area DA. The second scan driving circuit SDRV2 may be substantially parallel to the first scan driving circuit SDRV1. Some of the pixel circuits PC (e.g., refer to FIG. 6) of the pixels PX1 in the display area DA may be electrically connected to the first scan driving circuit SDRV1, and others thereof may be electrically connected to the second scan driving circuit SDRV2.

The terminal portion PAD may be arranged on a side of the substrate 100. The terminal portion PAD may be exposed by not being covered by an insulating layer, and electrically connected to a display circuit board 30. A display driver 32 may be arranged in the display circuit board 30.

The display driver 32 may be configured to generate a control signal, and the generated control signal may be transmitted to the first scan driving circuit SDRV1 and the second scan driving circuit SDRV2. The display driver 32 may generate a data signal, and the generated data signal may be transmitted to the pixel circuits PC (e.g., refer to FIG. 6) of the pixels PX1 through a fan-out line DW and a data line DL electrically connected to the fan-out line DW.

The display driver 32 may be configured to supply a driving voltage ELVDD to the driving voltage supply line 11 and supply a common voltage ELVSS (e.g., refer to FIG. 6) to the common voltage supply line 13. The driving voltage ELVDD may be applied to the pixel circuits PC (e.g., refer to FIG. 6) of the pixels PX1 through a driving voltage line PL electrically connected to the driving voltage supply line 11, and the common voltage ELVSS may be applied to opposite electrodes of display elements LE1 (e.g., refer to FIG. 12) through the common voltage supply line 13.

The driving voltage supply line 11 may be electrically connected to the terminal portion PAD and may extend in an x-direction under the display area DA. In another embodiment, a driving voltage supply line extending in the x-direction above the display area DA may be further included. In this case, some pixels may be electrically connected to the driving voltage supply line provided under the display area DA, and another pixels PX1 may be connected to the driving voltage supply line provided above the display area DA. The common voltage supply line 13 may be electrically connected to the terminal portion PAD and may have a shape in which a side thereof is open in a loop shape, to partially surround the display area DA.

Figure 6:
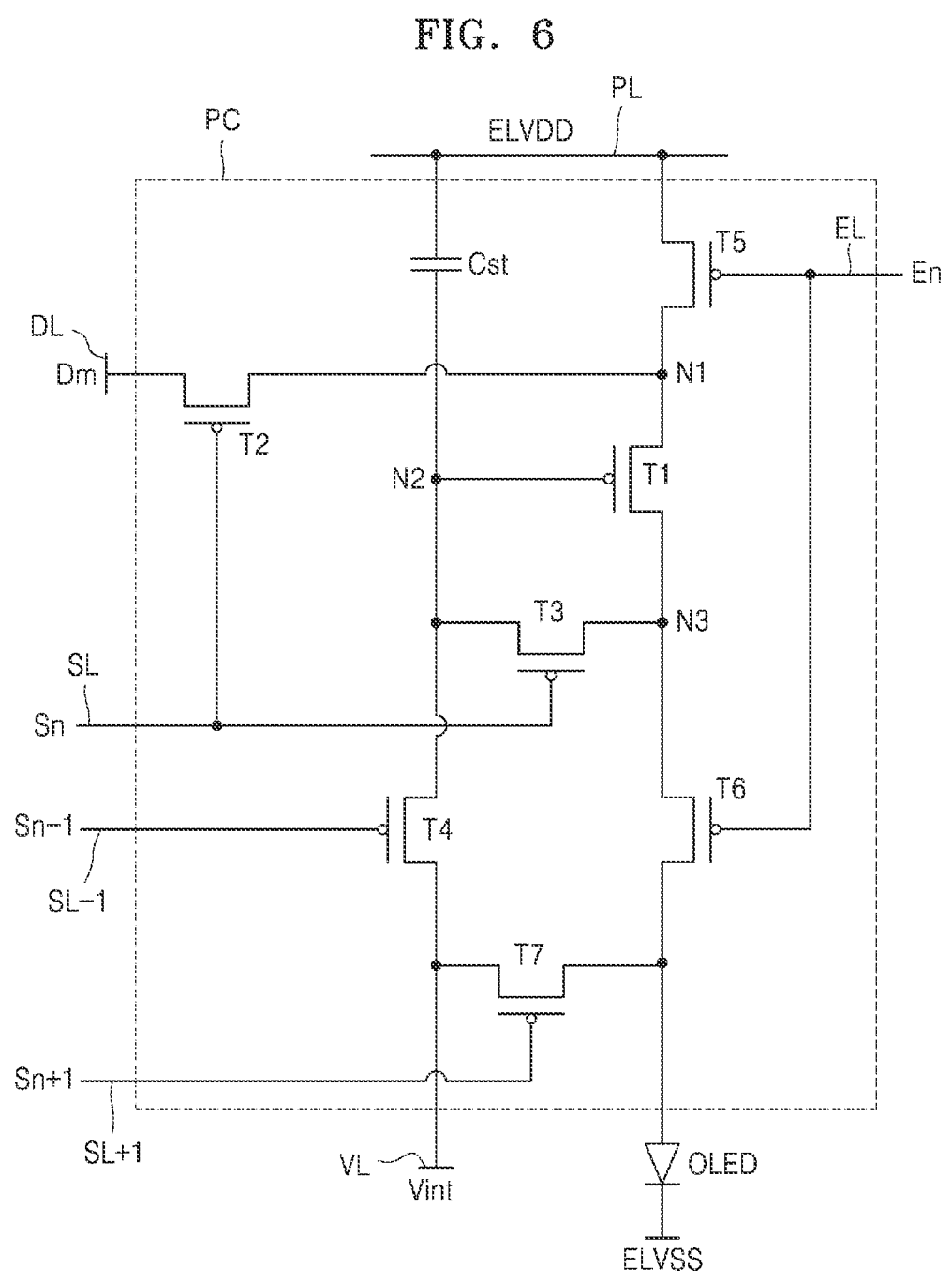

Although not illustrated, an initialization voltage supply line configured to supply an initialization voltage Vint (e.g., refer to FIG. 6) may be further arranged in the second non-display area NDA2 of the display panel 10, and the initialization voltage supply line may be configured to supply an initialization voltage Vint to the pixel PX1 through an initialization voltage line VL (e.g., refer to FIG. 6). An arrangement of the first and second scan driving circuits SDRV1 and SDRV2 may be similar to an arrangement of the initialization voltage supply lines, and the initialization voltage supply line may be provided on each of left and right sides of the substrate 100 and interposing the display area DA therebetween. For example, the initialization voltage supply lines may be disposed in the second non-display area NDA2, and the display area DA may be disposed between opposite initialization voltage supply lines.

FIG. 6 is a schematic diagram of an equivalent circuit of a pixel arranged on a display panel, according to an embodiment.

Referring to FIG. 6, the pixel PX1 (e.g., refer to FIG. 5) may include a pixel circuit PC and an organic light-emitting diode OLED. The organic light-emitting diode OLED may be a display element LE1 (e.g., refer to FIG. 12) electrically connected to the pixel circuit PC. The pixel circuit PC may include first to seventh transistors T1, T2, T3, T4, T5, T6, and T7. For example, the pixel circuit PC may further include a capacitor Cst. A first terminal of each of the first to seventh transistors T1 to T7 may be a source terminal or a drain terminal depending on the type of transistor (e.g., p-type or n-type) and/or operating conditions thereof, and a second terminal thereof may be a terminal different from the first terminal. For example, in case that the first terminal is a source terminal, the second terminal may be the drain terminal.

The pixel circuit PC may be electrically connected to a first scan line SL configured to transmit a first scan signal Sn, a second scan line SL−1 configured to transmit a second scan signal Sn−1, a third scan line SL+1 configured to transmit a third scan signal Sn+1, an emission control line EL configured to transmit an emission control signal En, a data line DL configured to transmit a data signal Dm, a driving voltage line PL configured to transmit a driving voltage ELVDD, and an initialization voltage line VL configured to transmit an initialization voltage Vint.

The first transistor T1 may include a gate terminal electrically connected to a second node N2, a first terminal electrically connected to a first node N1, and a second terminal electrically connected to a third node N3. The first transistor T1 may serve as a driving transistor. The first transistor T1 may be configured to receive a data signal Dm in response to a switching operation of the second transistor T2, and supply a driving current to a light-emitting element. The light-emitting element may be an organic light-emitting diode OLED.

The second transistor T2 (switching transistor) may include a gate terminal electrically connected to the first scan line SL, a first terminal electrically connected to the data line DL, and a second terminal electrically connected to the first node N1 (or first terminal of first transistor T1). The second transistor T2 may be turned on in response to the first scan signal Sn received through the first scan line SL, to perform a switching operation of transmitting the data signal Dm transmitted through the data line DL to the first node N1.

The third transistor T3 (or compensation transistor) may include a gate terminal electrically connected to the first scan line SL, a first terminal electrically connected to the second node N2 (or gate terminal of first transistor T1), and a second terminal electrically connected to the third node N3 (or second terminal of first transistor T1). The third transistor T3 may be turned on in response to the first scan signal Sn received through the first scan line SL, to diode-connect the first transistor T1. The third transistor T3 may have a structure in which two or more transistors are electrically connected in series.

The fourth transistor T4 (or first initialization transistor) may include a gate terminal electrically connected to the second scan line SL−1, a first terminal electrically connected to the initialization voltage line VL, and a second terminal electrically connected to the second node N2. The fourth transistor T4 may be turned on in response to the second scan signal Sn−1 received through the second scan line SL−1 and may be configured to transmit the initialization voltage Vint to the gate terminal of the first transistor T1.

Thus, the fourth transistor T4 may initialize a gate voltage of the first transistor T1. The fourth transistor T4 may have a structure in which two or more transistors are electrically connected in series.

The fifth transistor T5 (or first emission control transistor) may include a gate terminal electrically connected to the emission control line EL, a first terminal electrically connected to the driving voltage line PL, and a second terminal electrically connected to the first node N1. The sixth transistor T6 (or second emission control transistor) may include a gate terminal electrically connected to the emission control line EL, a first terminal electrically connected to the third node N3, and a second terminal electrically connected to a pixel electrode 121 (e.g., refer to FIG. 10A) of the organic light-emitting diode OLED. The fifth transistor T5 and the sixth transistor T6 may be turned on in response to the emission control signal En received through the emission control line EL, to cause a current to flow through the organic light-emitting diode OLED.

The seventh transistor T7 (or second initialization transistor) may include a gate terminal electrically connected to the third scan line SL+1, a first terminal electrically connected to the second terminal of the sixth transistor T6 and the pixel electrode 121 (e.g., refer to FIG. 10A) of the organic light-emitting diode OLED, and a second terminal electrically connected to the initialization voltage line VL. The seventh transistor T7 may be turned on in response to the third scan signal Sn+1 received through the third scan line SL+1 and may be configured to transmit the initialization voltage Vint to the pixel electrode 121 (e.g., refer to FIG. 10A) of the organic light-emitting diode OLED. Thus, the seventh transistor T7 may initialize a voltage of the pixel electrode 121 (e.g., refer to FIG. 10A) of the organic light-emitting diode OLED. However, the disclosure is not limited thereto, and the seventh transistor T7 may be omitted.

A capacitor Cst may include a first electrode electrically connected to the second node N2 and a second electrode electrically connected to the driving voltage line PL. The capacitor Cst may be electrically connected to the driving voltage line PL and the gate terminal of the first transistor T1 to store and maintain a voltage (e.g., voltage difference) corresponding to a difference between voltages at two ends (e.g., first and second electrodes) thereof. Thus, the capacitor Cst may maintain the voltage (e.g., voltage difference) applied to the gate electrode of the first transistor T1.

The organic light-emitting diode OLED may include a pixel electrode 121 (e.g., refer to FIG. 10A) and an opposite electrode facing the pixel electrode 121 (e.g., refer to FIG. 10A), and the opposite electrode may be configured to receive the common voltage ELVSS. The organic light-emitting diode OLED may be configured to receive the driving current from the first transistor T1 to emit light of a color. Thus, an image may be displayed. The opposite electrode of the organic light-emitting diode OLED may be provided in common to the pixels PX1 (e.g., refer to FIG. 5), for example, as one body.

Although the fourth transistor T4 and the seventh transistor T7 are respectively electrically connected to the second scan line SL−1 and the third scan line SL+1 in FIG. 6, one or more embodiments are not limited thereto. For example, in another embodiment, both the fourth transistor T4 and the seventh transistor T7 may be electrically connected to the first scan line SL to be driven in response to the first scan signal Sn.

Figure 7:
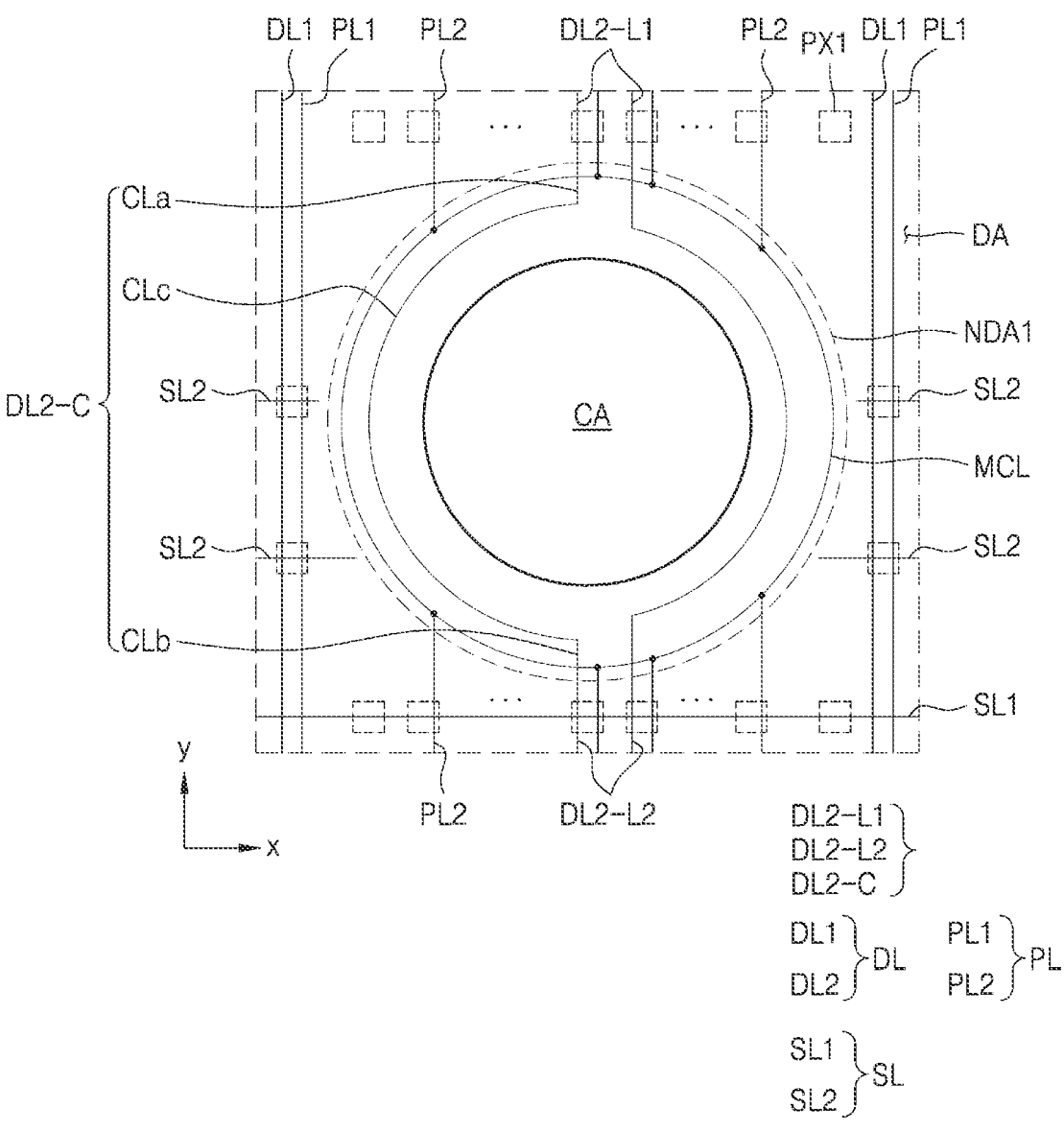
FIG. 7 is a schematic plan view of a portion of a display panel, according to an embodiment.

FIG. 7 is a schematic plan view of a portion of a display panel, according to an embodiment. For convenience of description, FIG. 7 illustrates only a portion of a display panel in a plan view, and more pixels are omitted. Also, FIG. 7 illustrates only wires necessary for description in a plan view, and more wires are omitted. In FIG. 7, a component area CA and a portion of a display area DA disposed around the component area CA are illustrated in a plan view.

Referring to FIG. 7, some of pixels PX1 formed in the display area DA may be spaced apart from each other with the component area CA therebetween. For example, the component area CA may be disposed between two pixels PX1 arranged in an x-direction of FIG. 7. The component area CA may be disposed between two pixels PX1 arranged in a y-direction of FIG. 7. In the display area DA, a data line DL and a driving voltage line PL may be spaced apart from each other in each column, and a scan line SL, an emission control line EL (e.g., refer to FIG. 6), and an initialization voltage line VL (e.g., refer to FIG. 6) may be spaced apart from each other in each row.

The data line DL may extend in the y-direction and may be configured to transmit a data signal to the pixel PX1. The data line DL may include a first data line DL1 and a second data line DL2. The first data line DL1 may be electrically connected to some pixels PX1 arranged in the same column in the display area DA. The second data line DL2 may be electrically connected to another pixels PX1 arranged in the same column in the display area DA and interposing the component area CA and the first non-display area NDA1 therebetween. For example, two pixels PX1 in the same column (e.g., two display elements LE1 (e.g., refer to FIG. 12) in the same column) arranged in the y-direction and interposing the component area CA and the first non-display area NDA1 therebetween may be electrically connected to the second data line DL2.

The second data line DL2 may include a first sub-data line DL2-L1, a second sub-data line DL2-L2, an auxiliary data line DL2-C. The first sub-data line DL2-L1 and the second sub-data line DL2-L2 may be arranged in the display area DA, and the auxiliary data line DL2-C may be arranged in the first non-display area NDA1. The first sub-data line DL2-L1 may extend in the y-direction and may be arranged above the component area CA. For example, the first sub-data line DL2-L1 may be disposed on a portion of the display area DA, which is disposed above the component area CA. The second sub-data line DL2-L2 may extend in the y-direction and may be arranged under the component area CA. For example, the second sub-data line DL2-L2 may be disposed on another portion of the display area DA, which is disposed under the component area CA. The auxiliary data line DL2-C may extend along the edge of the component area CA in the first non-display area NDA1 in an arc direction of the component area CA, and electrically connect the first sub-data line DL2-L1 to the second sub-data line DL2-L2. The auxiliary data line DL2-C may be bent in the first non-display area NDA1. For example, the auxiliary data line DL2-C may detour the component area CA in the first non-display area NDA1, and electrically connect the first sub-data line DL2-L1 to the second sub-data line DL2-L2 in the y-direction. The auxiliary data line DL2-C may include a first portion CLa, a second portion CLb, and a third portion CLc. The first portion CLa and the second portion CLb may extend in a direction parallel to the y-direction, and the third portion CLc may extend with a curvature in the arc direction of (e.g., may bypass or detour) the component area CA. The third portion CLc may electrically connect the first portion CLa to the second portion CLb between the first portion CLa and the second portion CLb.

In an embodiment, the first sub-data line DL2-L1, the second sub-data line DL2-L2, and the auxiliary data line DL2-C may be an integrated wire (e.g., may be integral with one another). In another embodiment, the auxiliary data line DL2-C may be arranged on a different layer from the first sub-data line DL2-L1 and the second sub-data line DL2-L2, and may be electrically connected to the first sub-data line DL2-L1 and the second sub-data line DL2-L2 through a contact hole. The auxiliary data line DL2-C may be arranged on an upper layer of the first sub-data line DL2-L1 and the second sub-data line DL2-L2 or may be arranged on a lower layer of the first sub-data line DL2-L1 and the second sub-data line DL2-L2.

The scan line SL may extend in the x-direction and may be configured to transmit a scan signal Sn (e.g., refer to FIG. 6) to the pixel PX1. The scan line SL may include a first scan line SL1 and a second scan line SL2. The first scan line SL1 may be electrically connected to some pixels PX1 arranged in the same row in the display area DA. The second scan line SL2 may be disconnected or separated with the component area CA and the first non-display area NDA1 disposed therebetween. A second scan line SL2 positioned on the left side of the component area CA and another second scan line SL2 positioned on the right side of the component area CA may be spaced apart from each other and interposing the component area CA therebetween. For example, two pixels PX1 in the same row (e.g., two display elements LE1 of FIG. 12 in the same row) arranged in the x-direction with the component area CA therebetween may be electrically connected to different second scan lines SL2. The second scan lines SL2 arranged on the left side of the component area CA may be electrically connected to a first scan driving circuit SDRV1 (e.g., refer to FIG. 5), and the second scan lines SL2 arranged on the right side of the component area CA may be electrically connected to a second scan driving circuit SDRV2 (e.g., refer to FIG. 5).

The driving voltage line PL may extend in the y-direction and may be configured to transmit the driving voltage ELVDD to the pixel PX1. The driving voltage line PL may include a first driving voltage line PL1 and a second driving voltage line PL2. The first driving voltage line PL1 may be electrically connected to the pixels PX1 arranged in the same column in the display area DA. The second driving voltage line PL2 may be disconnected or separated with the component area CA disposed therebetween. A second driving voltage line PL2 positioned above the component area CA and another second driving voltage line PL2 positioned under the component area CA may be spaced apart from each other with the component area CA therebetween. For example, two pixels PX1 in the same column (e.g., two display elements LE1 of FIG. 12 in the same column) arranged in the y-direction with the component area CA therebetween may be electrically connected to different second driving voltage lines PL2.

The second driving voltage line PL2 may be connected to a conductive layer MCL. The conductive layer MCL may be arranged in the first non-display area NDA1, and may extend in a circumferential direction of the component area CA. The conductive layer MCL may have a shape surrounding the component area CA. In an embodiment, the conductive layer MCL may have a linear shape. In another embodiment, the conductive layer MCL may have a plate-shaped structure arranged to cover substantially the entire first non-display area NDA1 For example, the conductive layer MCL may have a donut shape having an opening corresponding to the component area CA. In an embodiment, a width of the conductive layer MCL in a radial direction may be different for each position. In another embodiment, the width of the conductive layer MCL may be constant. A connection between the second driving voltage line PL2 and the conductive layer MCL will be described below.

Although not illustrated, an emission control line EL (e.g., refer to FIG. 6) and an initialization voltage line VL (e.g., refer to FIG. 6) may be further arranged on a substrate of the display panel 10 (e.g., refer to FIG. 5). Emission control lines EL (e.g., refer to FIG. 6) may extend in the x-direction, and some of the emission control lines EL may be disconnected by the component area CA disposed therebetween. Emission control lines EL (e.g., refer to FIG. 6) arranged on the left side of the component area CA may be electrically connected to the first scan driving circuit SDRV1 (e.g., refer to FIG. 5), and another emission control lines EL (e.g., refer to FIG. 6) arranged on the right side of the component area CA may be electrically connected to the second scan driving circuit SDRV2 (e.g., refer to FIG. 5). The initialization voltage lines VL (e.g., refer to FIG. 6) may extend in the x-direction, and some of the initialization voltage lines VL may be disconnected by the component area CA disposed therebetween. Some initialization voltage lines VL (e.g., refer to FIG. 6) arranged on the left side of the component area CA may be electrically connected to another initialization voltage line VL (e.g., refer to FIG. 6) on the left side of the component area CA, and some initialization voltage supply lines arranged on the right side of the component area CA may be electrically connected to an initialization voltage supply line on the right side of the component area CA.

Although not illustrated in FIG. 7, as described above, the second display area DA2 (e.g., refer to FIG. 12) may be arranged around the component area CA. In this case, the auxiliary pixel PX2 (e.g., refer to FIG. 13) arranged in the second display area DA2 (e.g., refer to FIG. 12) may be electrically connected to the pixel circuit PC (e.g., refer to FIG. 6) of the pixel PX1 arranged in the display area DA.

Figure 8A:
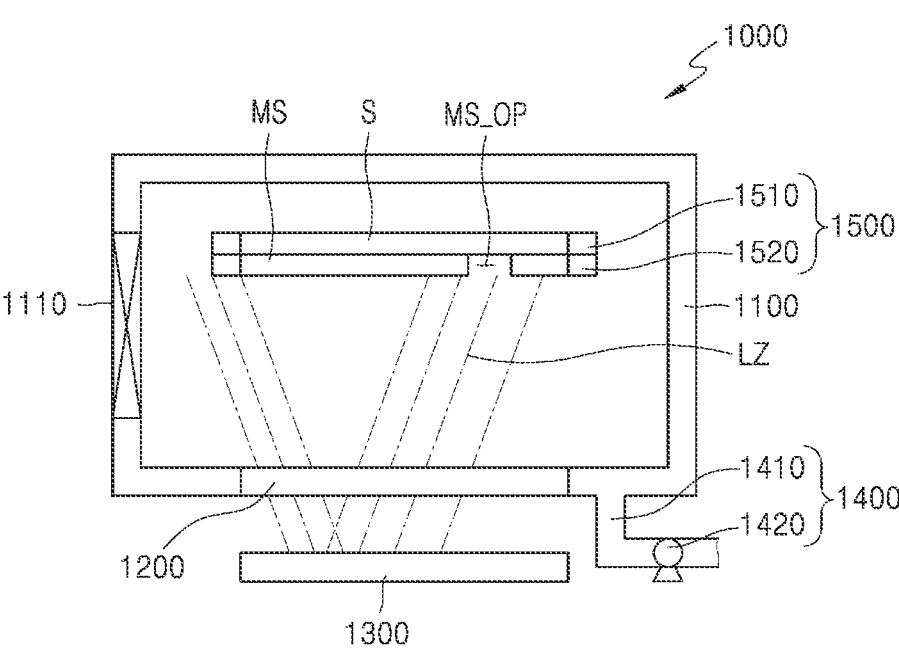
FIG. 8A is a schematic cross-sectional view of an apparatus for manufacturing a display device, according to an embodiment.
Figure 8B:
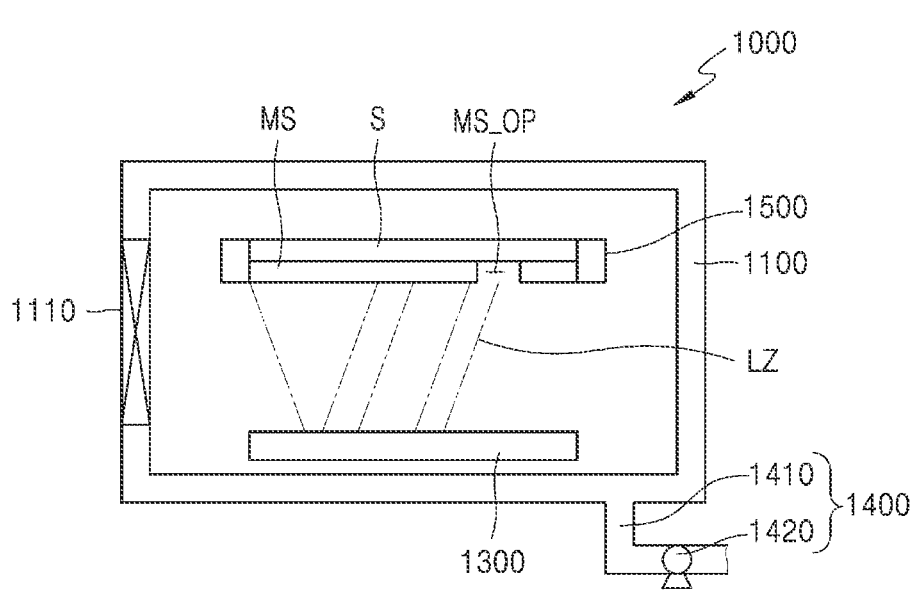
FIG. 8B is a schematic cross-sectional view of an apparatus for manufacturing a display device, according to another embodiment.

FIG. 8A is a cross-sectional view of an apparatus for manufacturing a display device, according to an embodiment. FIG. 8B is a cross-sectional view of an apparatus for manufacturing a display device, according to another embodiment.

Referring to FIG. 8A, the apparatus 1000 for manufacturing a display device 1 (e.g., refer to FIG. 1) may include a chamber 1100, a transmission window 1200, a lamp portion 1300, a pressure controller 1400, and a support portion 1500.

The chamber 1100 may have a space therein. A display substrate S and a mask MS may be arranged in the chamber 1100. In this case, the chamber 1100 may include an opening, and an opening/closing portion 1110 may be arranged in the opening. The opening/closing portion 1100 may include a gate valve. In this case, the opening/closing portion 1100 may open in case that the display substrate S and the mask MS are drawn into or withdrawn from the chamber 1100.

The transmission window 1200 may be arranged in the chamber 1100 to transmit external light into the chamber 1100. For example, the transmission window 1200 may be arranged in a portion of the chamber 1100 in which the lamp portion 1300 is arranged. In this case, the transmission window 1200 may include a transparent material such as acryl or glass.

In another embodiment, the transmission window 1200 may not be arranged in the chamber 1100 as illustrated in FIG. 8B. In this case, the chamber 1100 may include an opaque metallic material or the like.

The lamp portion 1300 may be arranged outside the chamber 1100 as illustrated in FIG. 8A. In this case, light LZ emitted from the lamp portion 1300 may travel or (be guided) into the chamber 1100 through the transmission window 1200. In another embodiment, the lamp portion 1300 may be arranged inside the chamber 1100 as illustrated in FIG. 8B.

The lamp portion 1300 as described above may include a flash lamp or a xenon lamp that is an electric arc lamp emitting white light.

The pressure controller 1400 may be connected to the chamber 1100 to control the pressure inside the chamber 1100. In this regard, the pressure controller 1400 may include a pipe 1410 connected to the chamber 1100 and a pump 1420 arranged in the pipe 1410. In this case, depending on operation of the pump 1420, gas inside the chamber 1100 may be discharged to the outside, or outside gas may be introduced into the chamber 1100.

The support portion 1500 may support at least one of the display substrate S and the mask MS. In an embodiment, the support portion 1500 may be in a shuttle form and may be linearly movable. In this case, the support portion 1500 may be coupled to the display substrate S and the mask MS, and move the display substrate S and the mask MS. In another embodiment, the support portion 1500 may include a first support portion 1510 arranged inside the chamber 1100 to support the display substrate S, and a second support portion 1520 arranged inside the chamber 1100 to support the mask MS. Thus, the first support portion 1510 may change the position of the display substrate S in at least one direction, and the second support portion 1520 may change the position of the mask MS in at least one direction. In this case, although not illustrated in the drawing, the display substrate S and the mask MS may be transported through a robot arranged outside or inside the chamber 1100. In another embodiment, the support portion 1500 may include a first support portion 1510 that supports one of the display substrate S and the mask MS, and a second support portion 1520 that supports the other of the display substrate S and the mask MS. In this case, one of the first support portion 1510 and the second support portion 1520 may be in a shuttle form that may move in and out of the chamber 1100. One of the first support portion 1510 and the second support portion 1520 may be in a form arranged inside the chamber 1100. For convenience of description, a case in which the support portion 1500 is in a shuttle form will be mainly described in detail.

Figure 9:
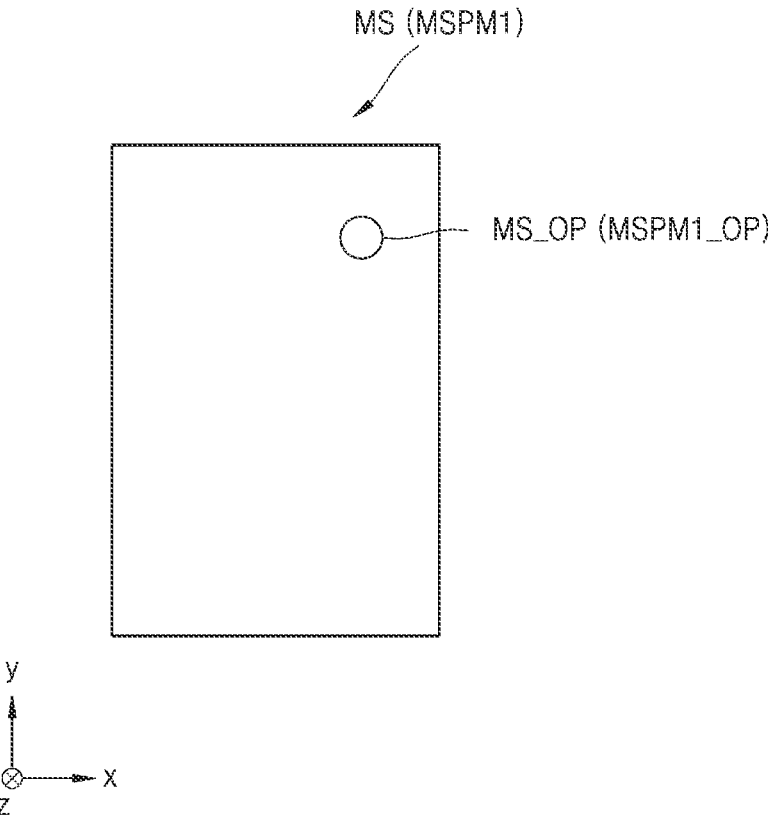
FIG. 9 is a schematic plan view of a mask illustrated in FIG. 8A or 8B.

FIG. 9 is a schematic plan view of a mask MS illustrated in FIG. 8A or 8B.

Referring to FIG. 9, the mask MS may include an opening area MS_OP. The opening area MS_OP may be formed corresponding to the transmission area illustrated in FIGS. 2A to 3C. In this case, the opening area MS_OP may have a hole shape so that light emitted from a lamp portion is transmitted. Portions of the mask MS other than the opening area MS_OP may include a metallic material. In this case, the portions of the mask MS other than the opening area MS_OP may be formed corresponding to the display area DA of the display panel 10.

FIGS. 10A to 10D are cross-sectional views of a method of manufacturing a display device, according to an embodiment.

Figure 10A:
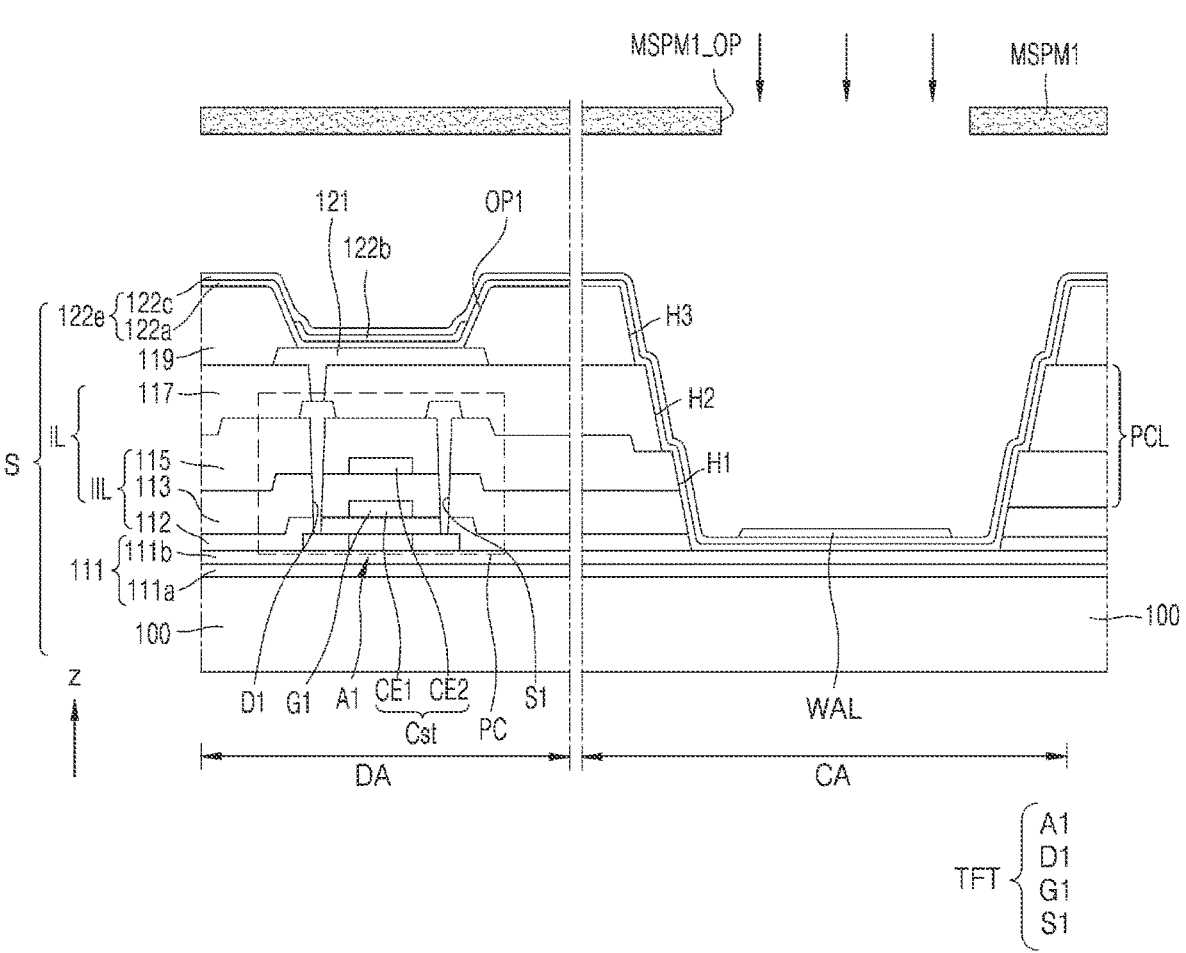
FIGS. 10A to 10D are schematic cross-sectional views of a method of manufacturing a display device, according to an embodiment.

Referring to FIG. 10A, a display substrate S may be manufactured and prepared. In this case, the display substrate S may include a substrate 100, a buffer layer 111, an inorganic insulating layer IIL, a pixel circuit PC, a planarization layer 117, a pixel-defining layer 119, a pixel electrode 121, an organic light-emitting layer 122*b*, and an organic functional layer 122*e*.

The display substrate S may have a structure in which the substrate 100, the buffer layer 111, a circuit layer PCL, and a display element layer EDL (e.g., refer to FIG. 10B) are stacked. In this case, the display panel 10 may include the display substrate S.

As described above, the substrate 100 may include an insulating material such as glass, quartz, or a polymer resin. The substrate 100 may include a rigid substrate or a flexible substrate that is bendable, foldable, or rollable.

The buffer layer 111 may be positioned on the substrate 100 to reduce or block the penetration of foreign materials, moisture, or external air from below the substrate 100. The buffer layer 111 may provide a flat surface over the substrate 100. The buffer layer 111 may include an inorganic material, an organic material, and a mixture of organic/inorganic composite. The inorganic material of the buffer layer 111 may include oxide or nitride, an organic material, or the like. The organic/inorganic composite of the buffer layer 111 may have a single-layered or multi-layered structure of an inorganic material and an organic material. A barrier layer (not illustrated) that blocks the penetration of external air may be further included between the substrate 100 and the buffer layer 111. In some embodiments, the buffer layer 111 may include at least one of silicon oxide ($SiO_2$) and silicon nitride ($SiN_x$). The buffer layer 111 may have a structure in which a first buffer layer 111*a* and a second buffer layer 111*b* are stacked.

The circuit layer PCL in the component area CA may be arranged on the buffer layer 111 and may include the pixel circuit PC, a first gate insulating layer 112, a second gate insulating layer 113, an interlayer insulating layer 115, and the planarization layer 117. The pixel circuit PC may include a thin-film transistor TFT and a storage capacitor Cst.

The thin-film transistor TFT may be arranged on the buffer layer 111. The thin-film transistor TFT may include a semiconductor layer A1, a gate electrode G1, a source electrode S1, and a drain electrode D1. The thin-film transistor TFT may be electrically connected to an organic light-emitting diode OLED (e.g., refer to FIG. 6) and drive the organic light-emitting diode OLED (e.g., refer to FIG. 6).

The semiconductor layer A1 may be arranged on the buffer layer 111 and may include polysilicon. In another embodiment, the semiconductor layer A1 may include amorphous silicon. In another embodiment, the semiconductor layer A1 may include an oxide of at least one material selected from the group consisting of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer A1 may include a channel region, a source region, and a drain region. The source region and the drain region of the semiconductor layer A1 may be doped with impurities.

The first gate insulating layer 112 may cover (or overlap in a plan view) the semiconductor layer A1. The first gate insulating layer 112 may include an inorganic insulating material including at least one of $SiO_2$, $SiN_x$, silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). In this case, ZnO may be zinc oxide (ZnO) and/or zinc peroxide ($ZnO_2$). The first gate insulating layer 112 may include a single layer or multiple layers including the aforementioned inorganic insulating materials.

The gate electrode G1 may be arranged on the first gate insulating layer 112 to overlap the semiconductor layer A1 in a plan view. The gate electrode G1 may include at least one of molybdenum (Mo), aluminum (Al), copper (Cu), and Ti, and may have a single-layered or multi-layered structure. For example, the gate electrode G1 may be a single Mo layer.

The second gate insulating layer 113 may cover the gate electrode G1. The second gate insulating layer 113 may include an inorganic insulating material including at least one of SiO$_2$, SiN$_x$, SiON, Al$_2$O$_3$, TiO$_2$, Ta$_2$O$_5$, HfO$_2$, and ZnO$_2$. In this case, ZnO may be ZnO and/or ZnO$_2$. The second gate insulating layer 113 may include a single layer or multiple layers including the aforementioned inorganic insulating materials.

An upper electrode CE2 of the storage capacitor Cst may be arranged on the second gate insulating layer 113.

In the display area DA, the upper electrode CE2 may overlap the gate electrode G1 disposed thereunder in a plan view. The gate electrode G1 and the upper electrode CE2 may overlap each other and interpose the second gate insulating layer 113 therebetween. The gate electrode G1 and the upper electrode CE2 may form the storage capacitor Cst in a plan view. The gate electrode G1 may be a lower electrode CE1 of the storage capacitor Cst.

The upper electrode CE2 may include at least one of Al, platinum (Pt), palladium (Pd), silver (Ag), magnesium (Mg), gold (Au), nickel (Ni), neodymium (Nd), iridium (Ir), Cr, calcium (Ca), Mo, Ti, tungsten (W), Cu, and an alloy thereof.

The interlayer insulating layer 115 may cover the upper electrode CE2. The interlayer insulating layer 115 may include at least one of SiO$_2$, SiN$_x$, SiON, Al$_2$O$_3$, TiO$_2$, Ta$_2$O$_5$, HfO$_2$, and ZnO$_2$. In this case, ZnO may be ZnO and/or ZnO$_2$. The interlayer insulating layer 115 may include a single layer or multiple layers including the aforementioned inorganic insulating materials.

The first gate insulating layer 112, the second gate insulating layer 113, and the interlayer insulating layer 115 may be collectively referred to as the inorganic insulating layer IIL, and the inorganic insulating layer IIL may include a first hole H1 corresponding to the component area CA. The first hole H1 may expose a portion of an upper surface of the buffer layer 111 or the substrate 100. The first hole H1 may be formed by overlapping an opening of the first gate insulating layer 112, an opening of the second gate insulating layer 113, and an opening of the interlayer insulating layer 115 in a plan view, which are formed corresponding to the component area CA. These openings of the first gate insulating layer 112, the second gate insulating layer 113, and the interlayer insulating layer 115 may be formed through separate processes or may be formed simultaneously through a same process. In case that the openings are formed through the separate processes, an inner surface of the first hole H1 may be not smooth and may have stair-shaped steps.

In other embodiments, the inorganic insulating layer IIL may include a groove rather than the first hole H1 exposing the buffer layer 111. As another example, the inorganic insulating layer IIL may not include the first hole H1 or the groove, which corresponds to the component area CA. The inorganic insulating layer IIL may include an inorganic insulating material having generally excellent light transmittance and has sufficient light transmittance even though the inorganic insulating layer IIL does not include a hole or groove corresponding to the component area CA. Thus, the component 20 (e.g., refer to FIGS. 2A to 3C) may transmit/receive a sufficient amount of light.

The source electrode S1 and the drain electrode D1 may be arranged on the interlayer insulating layer 115. The source electrode S1 and the drain electrode D1 may include at least one conductive material of Mo, Al, Cu, or Ti. However, the disclosure is not limited thereto. Each of the source electrode S1 and the drain electrode D1 may include a single layer or multiple layers including the aforementioned material. For example, each of the source electrode S1 and the drain electrode D1 may include a multi-layered structure of Ti/Al/Ti.

The planarization layer 117 may cover the source electrode S1 and the drain electrode D1. The planarization layer 117 may have a flat upper surface, and the pixel electrode 121 arranged thereon may be flat.

The planarization layer 117 may include an organic material or an inorganic material. The planarization layer 117 may have a single-layered structure or a multi-layered structure. The planarization layer 117 may include at least one of a general-purpose polymer, a polymer derivative having a phenol-based group, an acryl-based polymer, an imide-based polymer, an acryl ether-based polymer, an amide-based polymer, a fluorine-based polymer, a p-xylene-based polymer, and a vinyl alcohol-based polymer. The general-purpose polymer of the planarization layer 117 may include at least one of benzocyclobutene (BCB), polyimide, hexamethyldisiloxane (HMDSO), polymethyl methacrylate (PMMA), and polystyrene (PS). The planarization layer 117 may include at least one inorganic insulating material of SiO$_2$, SiN$_x$, SiON, Al$_2$O$_3$, TiO$_2$, Ta$_2$O$_5$, HfO$_2$, and ZnO$_2$. In this case, ZnO may be ZnO and/or ZnO$_2$. In case that the planarization layer 117 is formed, chemical mechanical polishing may be performed on an upper surface of a layer (e.g., planarization layer 117) to provide a flat upper surface after the layer is formed.

The planarization layer 117 may include a second hole H2 corresponding to the component area CA. The second hole H2 may overlap the first hole H1 in a plan view. FIG. 10A illustrates the second hole H2 greater than the first hole H1. In another embodiment, the planarization layer 117 may cover an edge of the first hole H1 of the inorganic insulating layer IIL. Thus, an area of the second hole H2 may be less than an area of the first hole H1.

The planarization layer 117 may include a via hole that exposes any one of the source electrode S1 and the drain electrode D1 of the thin-film transistor TFT, and the pixel electrode 121 may be electrically connected to the thin-film transistor TFT by contacting the source electrode S1 or the drain electrode D1 through the via hole.

The pixel electrode 121 may include at least one conductive oxide of indium tin oxide (ITO), indium zinc oxide (IZO), zinc oxide (ZnO), indium oxide (In$_2$O$_3$), indium gallium oxide (IGO), and aluminum zinc oxide (AZO). The pixel electrode 121 may include a reflective layer including at least one of Ag, Mg, Al, Pt, Pd, Au, Ni, Nd, Ir, and Cr. However, the disclosure is not limited thereto, and the pixel electrode may include an alloy or a combination of the above-described materials. For example, the pixel electrode 121 may have a structure including at least one layer including ITO, IZO, ZnO, or In$_2$O$_3$ disposed above and/or under the reflective layer. In this case, the pixel electrode 121$m$ may have a stack structure of ITO/Ag/ITO.

The pixel-defining layer 119 may cover an edge of the pixel electrode 121 on the planarization layer 117 and may include a first opening OP1 that exposes a central portion of the pixel electrode 121. A size and a shape of an emission area of the organic light-emitting diode OLED (e.g., refer to FIG. 6) (e.g., pixel) may be defined by the first opening OP1.

The pixel-defining layer 119 may increase a distance between the edge of the pixel electrode 121 and an opposite electrode 123 disposed above the pixel electrode 121, and prevent an electric arc or the like from occurring on the edge of the pixel electrode 121. The pixel-defining layer 119 may be formed of at least one organic insulating material such as polyimide, polyamide, an acrylic resin, benzocyclobutene, HMDSO, a phenolic resin by spin coating, or the like.

The pixel-defining layer 119 may include a third hole H3 positioned in the component area CA. The third hole H3 may overlap the first hole H1 and the second hole H2 in a plan view. The light transmittance in the component area CA may be improved by the first to third holes H1 to H3. Although the buffer layer 111 is continuously arranged corresponding to the component area CA in FIG. 10A, the buffer layer 111 may include a hole positioned in the component area CA. A portion of the opposite electrode 123 may be arranged on the inner surfaces of the first to third holes H1 to H3. Descriptions of the portion of the opposite electrode 123, which is arranged on the inner surfaces of the first to third holes H1 to H3, are provided below.

The organic light-emitting layer 122b may be arranged inside the first opening OP1 of the pixel-defining layer 119, and correspond to each pixel electrode 121. The organic light-emitting layer 122b may include a polymer material or a material of a low molecular weight and may emit red, green, blue, or white light.

The organic functional layer 122e may be disposed above and/or under the organic light-emitting layer 122b. The organic functional layer 122e may include a first functional layer 122a and/or a second functional layer 122c. The first functional layer 122a or the second functional layer 122c may be omitted.

The first functional layer 122a may be arranged under the organic light-emitting layer 122b. The first functional layer 122a may include a single layer or multiple layers including an organic material. The first functional layer 122a may be a hole transport layer (HTL) having a single-layered structure. As another example, the first functional layer 122a may include a hole injection layer (HIL) and an HTL. The first functional layer 122a may be formed as one body corresponding to the organic light-emitting diodes OLED included in the display area DA.

The second functional layer 122c may be arranged above the organic light-emitting layer 122b. The second functional layer 122c may include a single layer or multiple layers including an organic material. The second functional layer 122c may include an electron transport layer (ETL) and/or an electron injection layer (EIL). The second functional layer 122c may be formed as one body corresponding to the organic light-emitting diodes OLED included in the display area DA.

The opposite electrode 123 may be arranged on the second functional layer 122c. The opposite electrode 123 may include a conductive material having a low work function. For example, the opposite electrode 123 may include a (semi-)transparent layer including at least one of Ag, Mg, Al, Pt, Pd, Au, Ni, Nd, Ir, Cr, lithium (Li), Ca, and any alloy thereof. As another example, the opposite electrode 123 may further include a layer including at least one of ITO, IZO, ZnO, and $In_2O_3$ on the (semi-)transparent layer including the aforementioned material. The opposite electrode 123 may be formed as one body corresponding to the organic light-emitting diodes OLED included in the display area DA.

The layers from the pixel electrode 121 to the opposite electrode 123 on the display area DA may constitute the organic light-emitting diode OLED. For example, the pixel electrode 121, the first functional layer 122a, the organic light-emitting layer 122b, the second functional layer 122c, and the opposite electrode 123 may form (or constitute) the organic light-emitting diode OLED.

The first functional layer 122a, the second functional layer 122c, and the opposite electrode 123 may include a transmission hole corresponding to the component area CA. For example, each of the first functional layer 122a, the second functional layer 122c, and the opposite electrode 123 may include an opening corresponding to the component area CA. Areas of the openings of the first functional layer 122a, the second functional layer 122c, and the opposite electrode 123 may be substantially the same. For example, an area of the opening of the opposite electrode 123 may be substantially the same as an area of the transmission hole.

In case that the transmission hole corresponds to the component area CA, the transmission hole may overlap the component area CA in a plan view. In this case, the area of the transmission hole may be less than the area of the first hole H1 formed in the inorganic insulating layer IIL. For example, a width of the transmission hole of FIG. 10A may be less than a width of the first hole H1. The area of the transmission hole may be defined as an area of an opening having the smallest area of the openings constituting the transmission hole. The area of the first hole H1 may also be defined as an area of an opening having the smallest area of the openings constituting the first hole H1.

A portion of the opposite electrode 123 may not exist in the component area CA by the transmission hole, and the light transmittance in the component area CA may be increased. The opposite electrode 123 having the transmission hole may be formed in various manners. In an embodiment, the opposite electrode 123 having the transmission hole may be formed by using metal self-patterning (MSP).

In this case, the inorganic insulating layer IIL, the planarization layer 117, and the pixel-defining layer 119 arranged in the component area CA may be removed before the forming of the opposite electrode 123. For example, before the source electrode S1 and/or the drain electrode D1 is formed, the inorganic insulating layer IIL arranged in the component area CA may be removed to form the first hole H1 in case that a contact hole formed on the inorganic insulating layer IIL is formed. For example, the first hole H1 and the contact hole may be simultaneously formed through the inorganic insulating layer ILL, and the source electrode S1 and/or the drain electrode D1 may be formed on the organic insulating layer ILL having the contact hole. The planarization layer 117 arranged in the component area CA may be removed to form the second hole H2 in case that a contact hole for connecting the pixel electrode 121 to the drain electrode D1 or the pixel electrode 121 to the source electrode S1 is formed. For example, the second hole H2 and the contact hole may be simultaneously formed through the planarization layer 117, and the pixel electrode 121 may be formed on the planarization layer 117 having the contact hole. The pixel-defining layer 119 arranged in the component area CA may be removed to form the third hole H3 in case that an opening of the pixel-defining layer 119 is formed. For example, the third hole H3 and the opening may be simultaneously formed through the pixel-defining layer 119. The first hole H1, the second hole H2, and the third hole H3 may be formed in the inorganic insulating layer IIL, the planarization layer 117, and the pixel-defining layer 119, respectively.

A deposition material forming the opposite electrode 123 may have a characteristic in which a deposition result varies depending on a surface to be deposited. For example, in case that Mg is used to form the opposite electrode 123, Mg may have difficulty in forming a film on an interface (or layer) cleaned with some solvents such as methanol (MeOH), the HIL, the HTL, an interface (or layer) between the HIL and the HTL, or the pixel-defining layer 119, or the like. The HIL, the HTL, and an interface (or layer) between the HIL and the HTL may be included in the first functional layer 122a. Thus, a self-patterning technique may be used for the opposite electrode 123 including Mg. In the self-patterning technique, before the opposite electrode 123 is formed, a weak adhesion layer WAL may be formed corresponding to the component area CA. For example, the weak adhesion layer WAL may be formed on an upper surface of the second functional layer 122c inside the first hole H1 of the inorganic insulating layer IIL. The weak adhesion layer WAL may be formed corresponding to the component area CA by using a weak adhesion mask MSPM1 including an opening MSPM1_OP corresponding to the component area CA.

The weak adhesion layer WAL may include a material having weak adhesion to (or detachable from) the opposite electrode 123. The material of the weak adhesion layer WAL may have a characteristic in which the opposite electrode 123 is not formed thereon. For example, the opposite electrode 123 may be formed very thinly on an upper surface of the weak adhesion layer WAL.

For example, the weak adhesion layer WAL may be formed by using at least one material of 8-quinolinato-lithium ([8-quinolinolato lithium] (Liq)), N,N-diphenyl-N, N-bis(9-phenyl-9H-carbazol-3-yl)biphenyl-4,4'-diamine (N,N-diphenyl-N,N-bis(9-phenyl-9H-carbazol-3-yl)biphe-nyl-4,4'-diamine (HT01)), N(diphenyl-4-yl)9,9-dimethyl-N-(4(9-phenyl-9H-carbazol-3-yl)phenyl)-9H-fluoren-2-amine (N(diphenyl-4-yl)9,9-dimethyl-N-(4(9-phenyl-9H-carba-zol-3-yl)phenyl)-9H-fluorene-2-amine (HT211)), and 2-(4-(9,10-di(naphthalen yl)anthracen-2-yl)phenyl)-1-phenyl-1H-benzo-[D]imidazole (2-(4-(9,10)-di(naphthalene yl)anthracene-2-yl)phenyl)-1-phenyl-1H-benzo-[D]imida-zole (LG201)). However, the disclosure is not limited thereto.

Figure 10B:
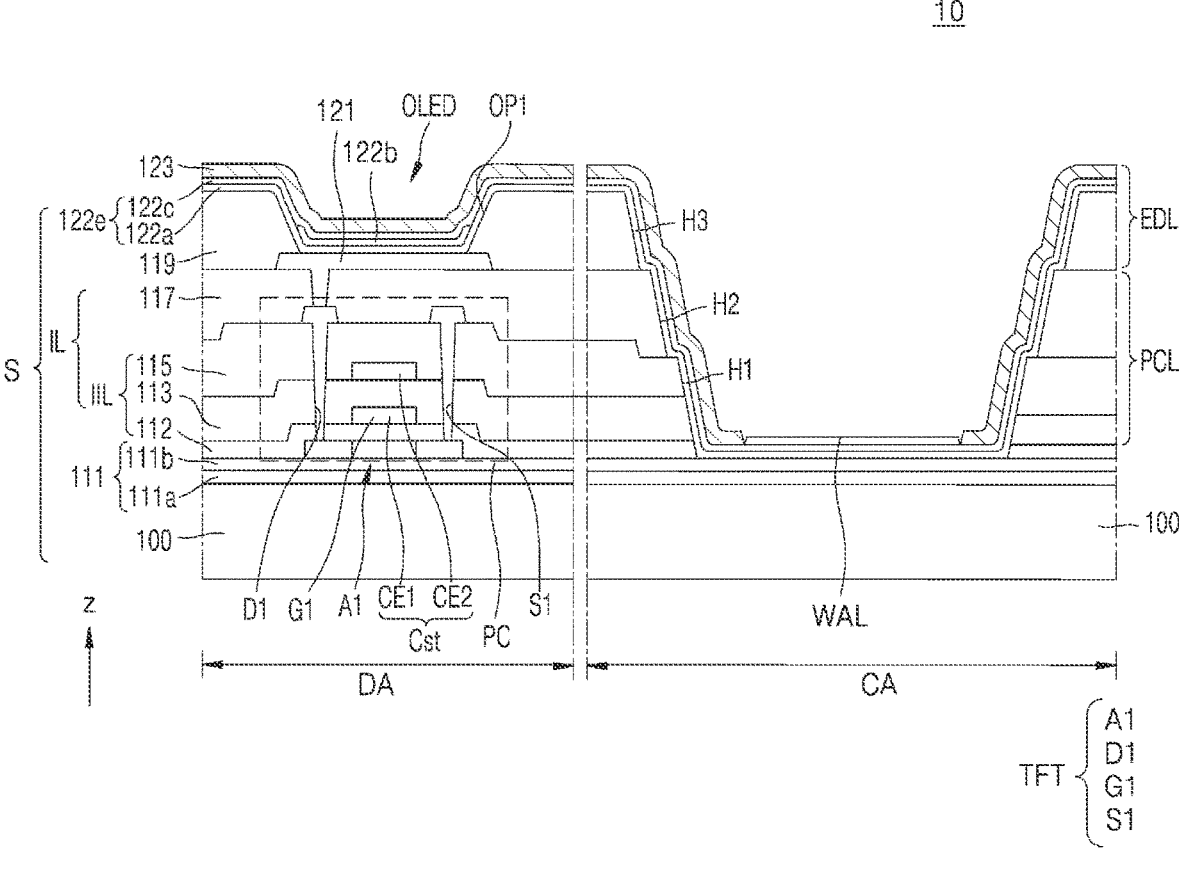

Referring to FIG. 10B, the opposite electrode 123 may be formed over the entire display area DA and at least part of the component area CA by using an open mask on the weak adhesion layer WAL.

As illustrated in FIG. 10B, the deposition material for the opposite electrode 123 may have weak adhesion to the weak adhesion layer WAL, and the opposite electrode 123 may not be formed on the upper surface of the weak adhesion layer WAL. Thus, the transmission hole may be formed through the opposite electrode 123 in the component area CA.

As described above, a display substrate S including the opposite electrode 123 may be introduced (or inserted) into the apparatus 1000 for manufacturing a display device illustrated in FIG. 8A or 8B. In this case, the display substrate S may be connected (or coupled) to the mask MS outside the chamber 1100, and move from the outside of the chamber 1100 to the inside of the chamber 1100.

In the aforementioned case, the weak adhesion layer WAL may be exposed to the outside through an opening area MS_OP of the mask MS. In this case, in case that the opening area MS_OP and the weak adhesion layer WAL are arranged on the same plane, the weak adhesion layer WAL may be inserted into the opening area MS_OP.

As described above, after the mask MS is arranged, the lamp portion 1300 (e.g., refer to FIG. 8A or 8B) may irradiate light LZ to the mask MS. In this case, the lamp portion 1300 (e.g., refer to FIG. 8A or 8B) may be arranged under the mask MS, and the weak adhesion layer WAL may face the lamp portion 1300 (e.g., refer to FIG. 8A or 8B).

In case that the lamp portion 1300 (e.g., refer to FIG. 8A or 8B) emits the light LZ, the light LZ may reach the weak adhesion layer WAL and the organic functional layer 122e arranged around the weak adhesion layer WAL through the opening area MS_OP. The light LZ may be removed by sublimating the weak adhesion layer WAL and the organic functional layer 122e arranged in the component area CA. In this case, the organic functional layer 122e may be removed from the entire component area CA. In another embodiment, the organic functional layer 122e may be removed from a portion of the component area CA. In this case, a removed area of the organic functional layer 122e may be the same as or slightly greater than the opening area MS_OP of the mask MS.

After the aforementioned process is completed, the display substrate S may be transported to the outside of the chamber 1100, and then, an encapsulation substrate 300a (e.g., refer to FIG. 2A) or a thin-film encapsulation layer 300b (e.g., refer to FIG. 3A) may be formed on the display substrate S.

Figure 11:
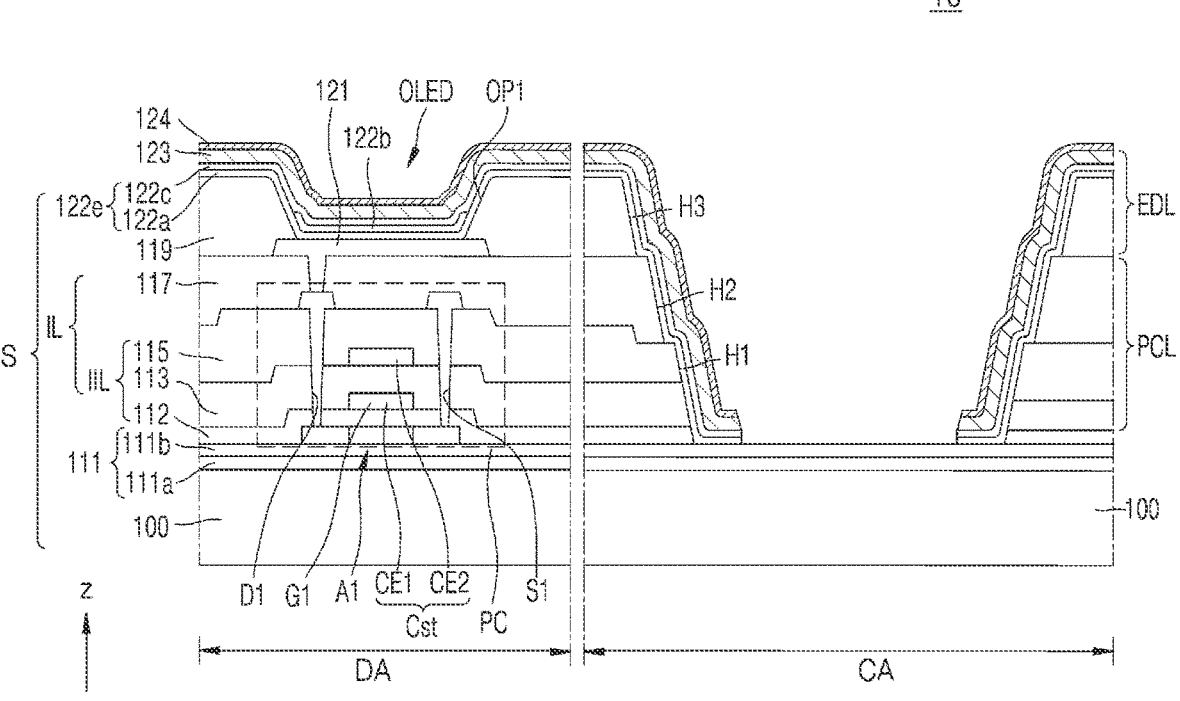
FIG. 11 is a schematic cross-sectional view of a portion of a display panel, according to an embodiment.

FIG. 11 is a cross-sectional view of a portion of a display panel, according to an embodiment.

Figure 10C:
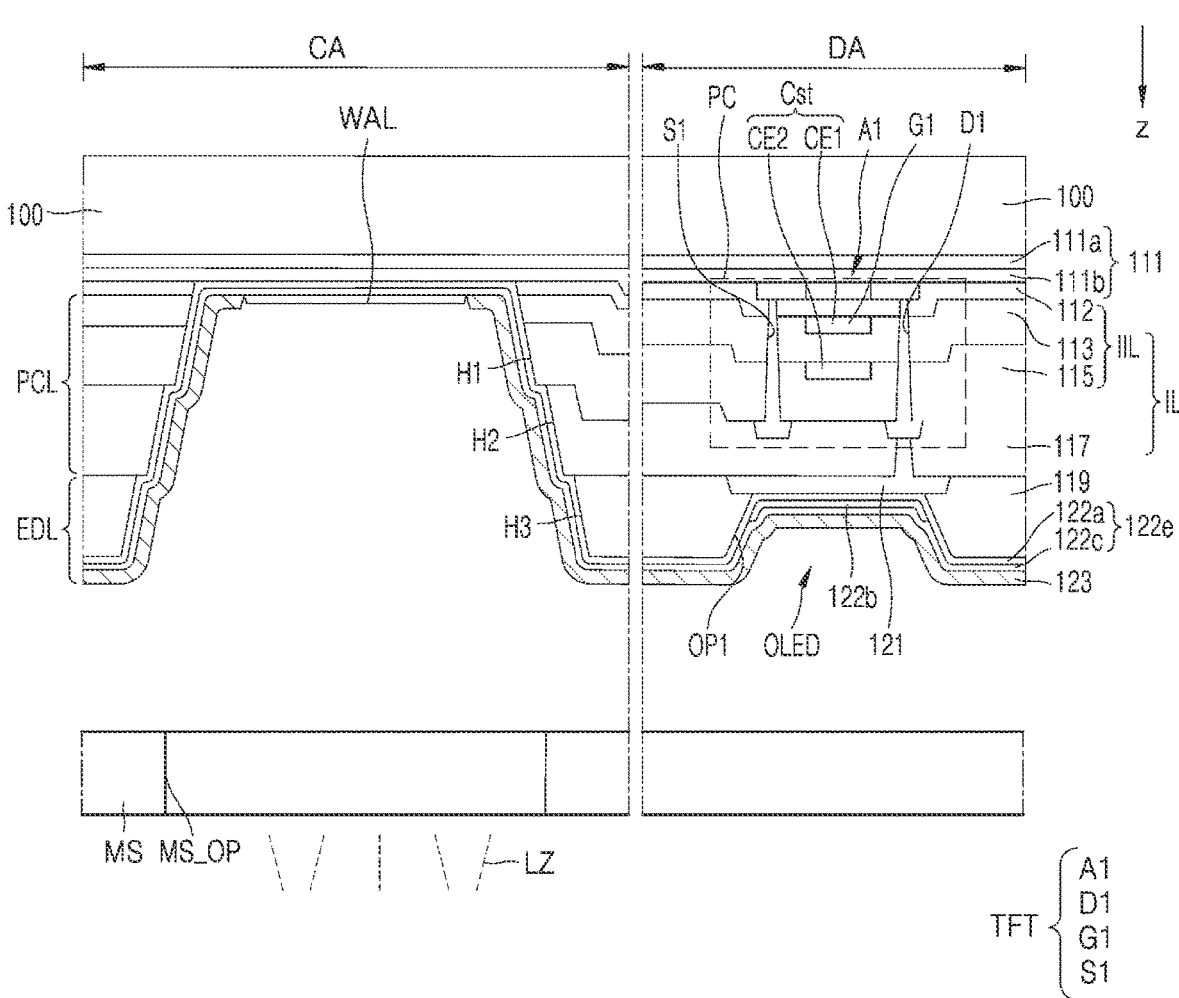
Figure 10D:
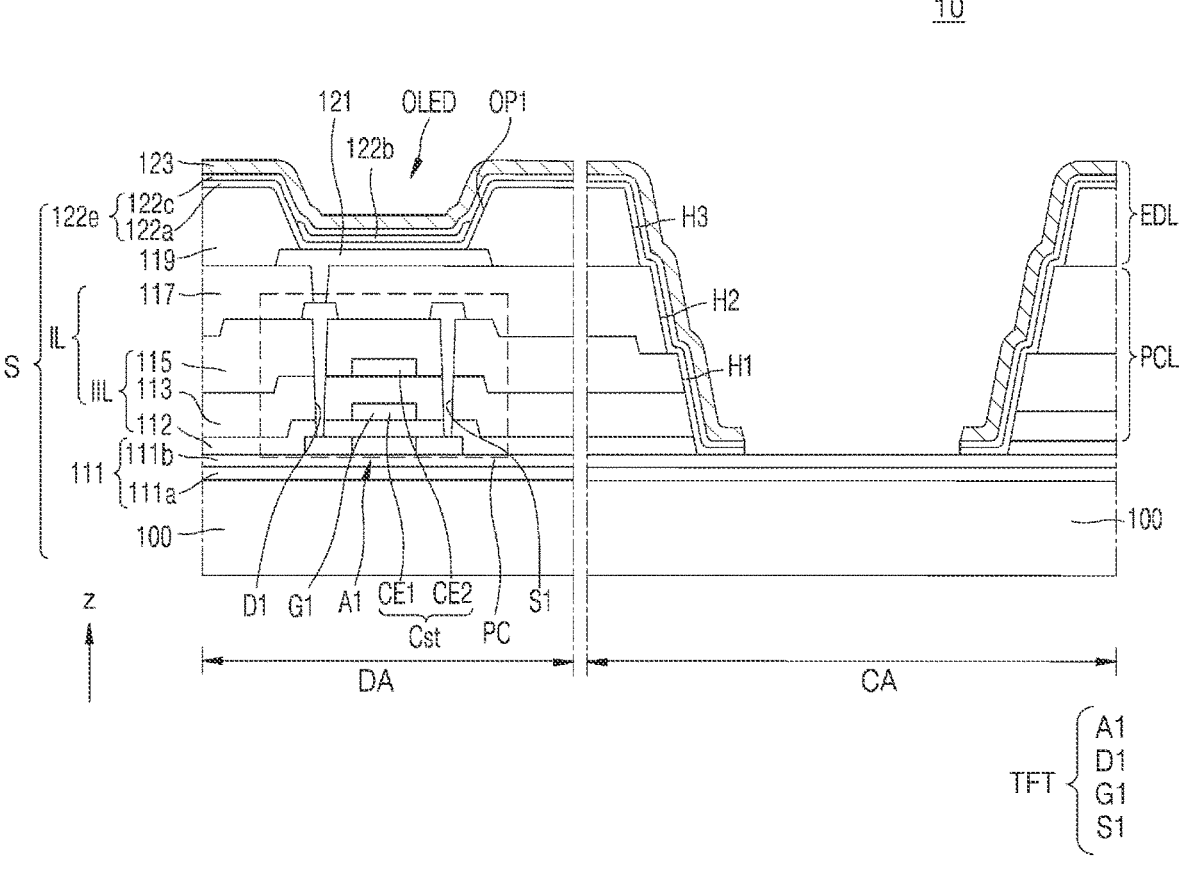

Referring to FIG. 11, the display panel 10 may include the display substrate S illustrated in FIGS. 10A to 10C, and a capping layer 124 arranged on an opposite electrode 123. In this case, the capping layer 124 may be a layer protecting the opposite electrode 123 and increase light extraction efficiency (or luminance). The capping layer 124 may include an organic material having a refractive index higher than that of the opposite electrode 123. As another example, the capping layer 124 may be provided by stacking layers having different refractive indices. For example, the capping layer 124 may include a stack (e.g., triple layers) of a high refractive index layer/a low refractive index layer/a high refractive index layer. In this case, a refractive index of the high refractive index layer may be about 1.7 or more, and a refractive index of the low refractive index layer may be about 1.3 or less.

The capping layer 124 may further include lithium fluoride (LiF). As another example, the capping layer 124 may include an inorganic insulating layer such as $SiO_2$ and $SiN_X$. For example, the display substrate S including the capping layer 124 may be arranged in the apparatus 1000 for manufacturing the display device illustrated in FIG. 8A or 8B. For example, after the forming of the capping layer 124, the display substrate S may be arranged in the apparatus 1000 (e.g., refer to FIG. 8A or 8B) for manufacturing the display device. In this case, the display substrate S may include the capping layer 124 and a substrate 100.

For example, after an inorganic insulating layer IIL and an organic light-emitting layer 122b are formed on the substrate 100, as illustrated in FIG. 10B, a weak adhesion layer WAL may be arranged in a component area CA, and the opposite electrode 123 may be formed. In this case, the opposite electrode 123 may not be formed on the weak adhesion layer WAL (e.g., refer to FIG. 10B).

After the aforementioned process is completed, the capping layer 124 may be formed on the opposite electrode 123. In this regard, the capping layer 124 may be formed over the entire surface of the substrate 100. In this case, the capping layer 124 may also be formed in the component area CA as illustrated in FIG. 11. Although not illustrated in FIG. 11, the capping layer 124 may be formed on the weak adhesion layer WAL illustrated in FIG. 10B.

In case that the aforementioned process is completed, as illustrated in FIG. 10C, a mask MS may be arranged, and light LZ may be irradiated through a lamp portion 1300 (e.g., refer to FIG. 8A or 8B). The light LZ may reach at least a portion of the component area CA through an opening area MS_OP of the mask MS. The light LZ may remove a portion of the organic functional layer 122e and a portion of the capping layer 124 arranged in at least a portion of the component area CA. In case that the portion of the organic functional layer 122e and the portion of the capping layer 124, which are arranged in the portion of the component area CA, are removed as described above, the shape thereof may be the same as or similar to that illustrated in FIG. 11.

In case that the aforementioned process is completed, the display substrate S may be withdrawn (or separated) from the chamber 1100 (e.g., refer to FIG. 8A or 8B) and an encapsulation substrate 300a or a thin-film encapsulation layer 300b may be formed on the display substrate S. Thus, manufacturing process of the display panel 10 may be completed. In this case, in case that a hole is formed in the substrate 100 and various layers arranged on the substrate 100 as in FIGS. 2A, 2B, 3A, 3B, and 3C, a hole may be formed in the substrate 100 after the encapsulation substrate 300a or the thin-film encapsulation layer 300b is formed, or the encapsulation substrate 300a or the thin-film encapsulation layer 300b may be formed after a hole is formed in the substrate 100.

Therefore, according to the apparatus for manufacturing the display device and the method of manufacturing the display device, at least one of the organic functional layer 122e and the capping layer 124 in the component area CA may be removed in a simple manner. According to the apparatus for manufacturing the display device and the method of manufacturing the display device, at least one of the organic functional layer 122e and the capping layer 124 may be removed without a high-energy laser, and a pixel PX1 (e.g., refer to FIG. 7) disposed adjacent to the component area CA may not be damaged.

Figure 12:
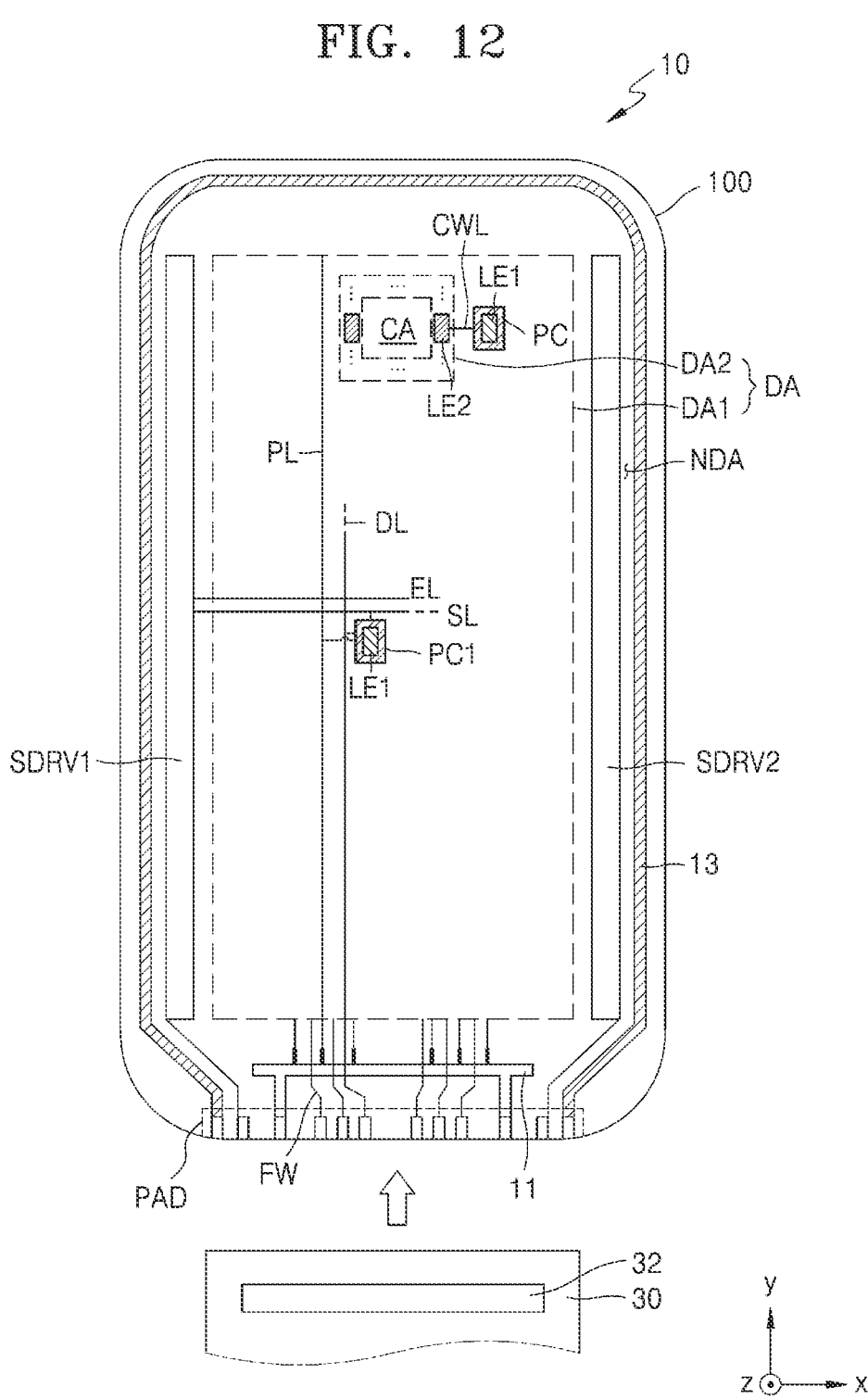
FIG. 12 is a schematic plan view of a display panel according to an embodiment.
Figure 13:
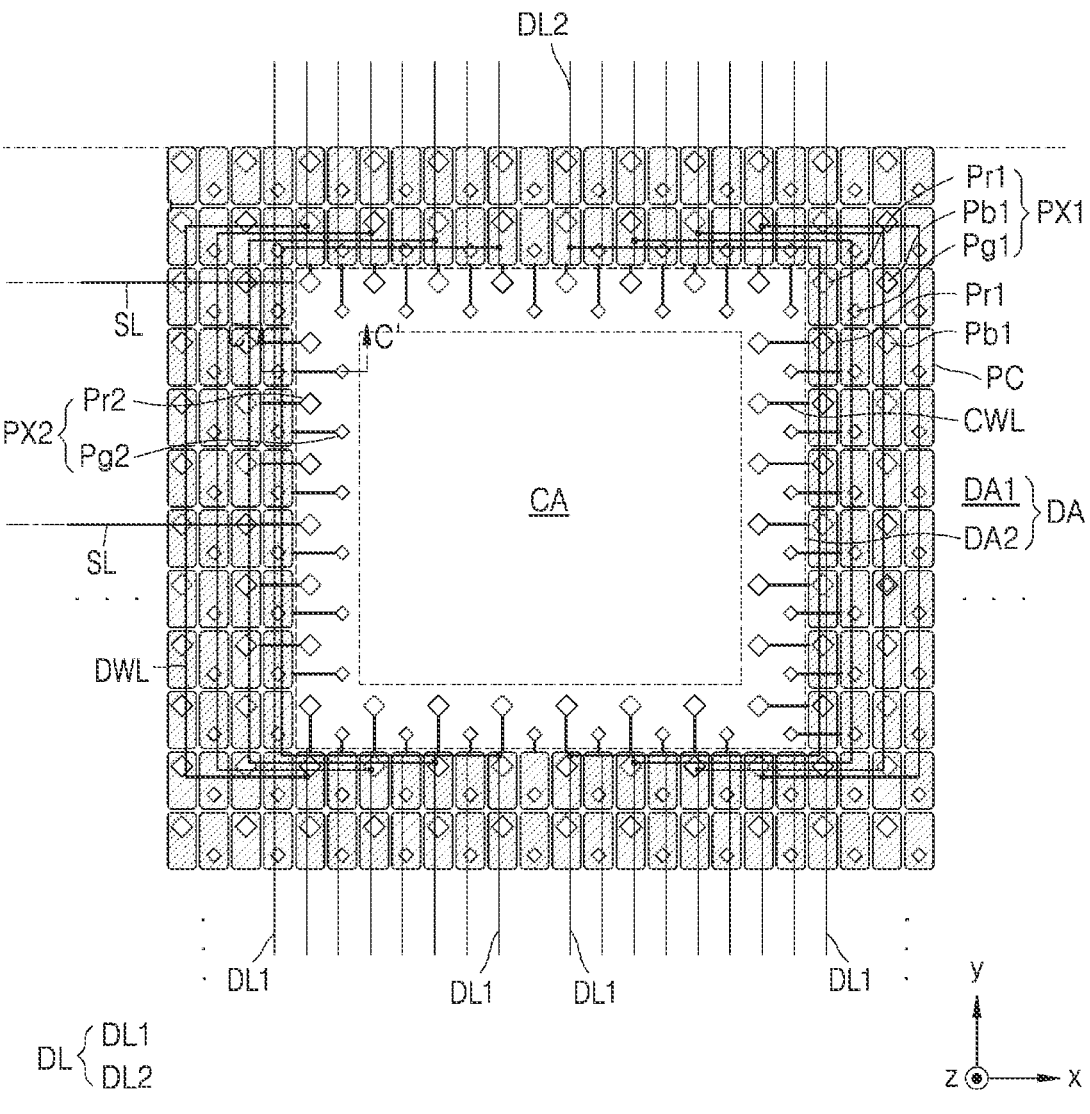
FIG. 13 is a schematic plan view of a portion of a display area of the display panel illustrated in FIG. 12.

FIG. 12 is a schematic plan view of a display panel according to an embodiment. FIG. 13 is a schematic plan view of a portion of a display area of the display panel illustrated in FIG. 12.

Referring to FIGS. 12 and 13, various elements constituting the display panel 10 may be arranged on a substrate 100. In this case, because the display panel 10 is substantially identical or similar to that of FIG. 5, a detailed description of the same constituent elements of the display panel 10 illustrated in FIG. 5 is omitted.

The display panel 10 may include a display area DA and a non-display area NDA surrounding the display area DA. The display area DA may include a first display area DA1 and a second display area DA2. A first image may be displayed in the first display area DA1. A component area CA may be arranged in the second display area DA2, and a second image may be displayed in the second display area DA2. The second image may form a whole image together with the first image. For example, the whole image may be formed by the first image and the second image.

A first display element LE1 such as an OLED may be arranged in the first display area DA1. The first display element LE1 may emit light of a color through a pixel PX1 (refer to, e.g., FIG. 1). For example, the pixel PX1 may be implemented by the first display element LE1 and may be a sub-pixel. The first display element LE1 may emit, for example, red, green, blue, or white light. A pixel circuit PC configured to drive the first display element LE1 may be arranged in the first display area DA1 and may be electrically connected to the first display element LE1. For example, the pixel circuit PC may overlap the first display element LE1 in a plan view.

As illustrated in FIG. 12, the second display area DA2 may be positioned on a side of the entire display area DA and may be partially surrounded by the first display area DA1. A second display element LE2 such as an OLED may be arranged in the second display area DA2. The second display element LE2 may emit light of a color through the auxiliary pixel PX2. For example, the auxiliary pixel PX2 may be implemented by the second display element LE2 and may be a sub-pixel. The second display element LE2 may emit, for example, red, green, blue, or white light.

The pixel PX1 and the auxiliary pixel PX2 that are electrically connected to the pixel circuit PC may simultaneously emit light. For example, in case that the pixel PX1 electrically connected to the pixel circuit PC to which the auxiliary pixel PX2 is electrically connected and operates, the auxiliary pixel PX2 may also operate. For example, the pixel PX1 and the auxiliary pixel PX2 may operate simultaneously. In this case, the pixel PX1 and the auxiliary pixel PX2 that are electrically connected to the same pixel circuit PC may emit light of the same color.

The component area CA may be arranged inside the second display area DA2. The second display elements LE2 may surround the component area CA. In this case, a planar shape of the component area CA may vary. For example, the planar shape of the component area CA may include a polygonal shape, a circular shape, or an elliptical shape. Hereinafter, for convenience of description, a case in which the planar shape of the component area CA is rectangular will be mainly described in detail.

The pixel circuit PC may be electrically connected to external circuits arranged in the non-display area NDA. A first scan driving circuit SDRV1, a second scan driving circuit SDRV2, a terminal portion PAD, a driving voltage supply line 11, and a common voltage supply line 13 may be arranged in the non-display area NDA.

The first scan driving circuit SDRV1 may be configured to apply a scan signal to each pixel circuit PC through the scan line SL. Each of the pixel circuit PC may be configured to drive the first display element LE1. The first scan driving circuit SDRV1 may be configured to apply an emission control signal to each pixel circuit PC through an emission control line EL. The second scan driving circuit SDRV2 may be positioned on an opposite side of the first scan driving circuit SDRV1 with respect to the first display area DA1. The second scan driving circuit SDRV2 may be substantially parallel to the first scan driving circuit SDRV1. Some of the pixel circuits PC of the first display area DA1 may be electrically connected to the first scan driving circuit SDRV1, and others thereof may be electrically connected to the second scan driving circuit SDRV2.

Multiple pixels PX1 may be arranged in the first display area DA1. The reference character PX1 or PX2 used herein may refer to a sub-pixel as a minimum part for implementing an image, and may be defined as an emission area from which a display element (e.g., first or second display element LE1 or LE2) emits light. In case that the display element is an OLED, the emission area may be defined by an opening OP1 or OP2 (e.g., refer to FIG. 14A) of a pixel-defining layer 119 (e.g., refer to FIG. 14A).

Each of the pixels PX1 may emit any one of red, green, blue, and white light. For example, the pixels PX1 may include a red pixel Pr1, a green pixel Pg1, and a blue pixel Pb1.

The pixels PX1 may be arranged in various types, and for example, as illustrated in FIG. 4, may be arranged in a Pentile® type. For example, the red pixel Pr1 may be arranged at first and third vertexes facing each other among vertexes of a virtual rectangle having a central point of the green pixel Pg1 as a central point of the virtual rectangle, and the blue pixel Pb1 may be arranged at second and fourth vertexes that are other vertexes of the virtual rectangle. For example, the virtual rectangle is defined by the central point of the green pixel Pg1 and the four vertexes, and the red pixel Pr1 and the blue pixel Pb1 may be alternately arranged at the vertexes. A size of the green pixel Pg1 may be less than a size of each of the red pixel Pr1 and the blue pixel Pb1. Thus, high resolution may be implemented with a small number of the pixels PX1. One or more embodiments are not limited thereto, and the pixels PX1 may be arranged in various forms, such as a stripe type, a mosaic arrangement type, a delta arrangement type, and the like.

The pixel circuits PC may overlap the pixels PX1 in the first display area DA1 in a plan view. The pixel circuits PC may be arranged in, for example, a matrix form forming rows and columns in an x-direction and a y-direction.

Multiple auxiliary pixels PX2 may be arranged in the second display area DA2. Each of the auxiliary pixels PX2 may emit any one of red, green, blue, and white light. For example, the auxiliary pixels PX2 may include a red auxiliary pixel Pr2, a green auxiliary pixel Pg2, and a blue auxiliary pixel (not illustrated). In this case, the auxiliary pixels PX2 may include at least one of the red auxiliary pixel Pr2, the green auxiliary pixel Pg2, and the blue auxiliary pixel depending on a size of the second display area DA2. For convenience of description, a case in which the red auxiliary pixel Pr2 and the green auxiliary pixel Pg2 are arranged in the second display area DA2 will be mainly described in detail.

In the second display area DA2, the auxiliary pixels PX2 may be arranged in various types. In an embodiment, some auxiliary pixels PX2 may be gathered to form a pixel group, and the auxiliary pixels PX2 may be arranged in the pixel group in various types, such as a Pentile® type, a stripe type, a mosaic arrangement type, a delta arrangement type, and the like.

As illustrated in FIG. 13, the auxiliary pixels PX2 may be distributed in the second display area DA2. In this case, a distance between adjacent ones of the auxiliary pixels PX2 may be the same as a distance between adjacent ones of the pixels PX1. For example, the arrangement of the auxiliary pixels PX2 may be the same as the arrangement of the pixels PX1. In another embodiment, the distance between adjacent ones of the auxiliary pixels PX2 may be greater than the distance between adjacent ones of the pixels PX1. In this case, the number of auxiliary pixels PX2 per same area in the second display area DA2 may be less than the number of pixels PX1 per same area in the first display area DA1. For example, a density of the auxiliary pixels PX2 in the second display area DA2 may be smaller than a density of the pixels PX1 in the first display area DA1. The component area CA that has high light transmittance and in which auxiliary pixels PX2 are not arranged may be arranged in the second display area DA2.

A connection line CWL may be electrically connected to the pixel circuit PC to drive the auxiliary pixel PX2 arranged in the second display area DA2. The connection line CWL may include a conductive material and may electrically connect the pixel circuit PC to the auxiliary pixel PX2. In this case, being electrically connected to the auxiliary pixel PX2 may refer to being electrically connected to a pixel electrode of the second display element LE2 implementing the auxiliary pixel PX2.

The connection line CWL may extend from the first display area DA1 to the second display area DA2 and may include a transparent conductive material. The connection line CWL may include, for example, a transparent conducting oxide (TCO). For example, the connection line CWL may include a conductive oxide, such as ITO, IZO, ZnO, $In_2O_3$, IGO, indium zinc gallium oxide (IZGO), or AZO. Accordingly, even though the connection line CWL is arranged in the second display area DA2, a decrease in the light transmittance of the second display area DA2 may be reduced.

The scan line SL may be electrically connected to the pixel circuits PC. The scan line SL may extend in the x-direction and may be electrically connected to pixel circuits PC arranged in the same row. In this case, the scan line SL may be arranged in the first display area DA1 and may be electrically connected to the pixel circuits PC arranged in the same row. The scan line SL may not be arranged in the second display area DA2. For example, the scan line SL may be disconnected by the second display area DA2 disposed therebetween. In this case, a scan line SL arranged on a left side of the second display area DA2 may be configured to receive a scan signal from the first scan driving circuit SDRV1 (e.g., refer to FIG. 12), and a scan line SL arranged on a right side of the second display area DA2 may be configured to receive a scan signal from the second scan driving circuit SDRV2 (e.g., refer to FIG. 12).

The scan line SL may be configured to apply the same signal to pixel circuits configured to drive the pixels PX1 arranged in the same row.

The data line DL may be electrically connected to the pixel circuits PC. The first data line DL1 may extend in the y-direction and may be electrically connected to pixel circuits PC arranged in the same column. The second data line DL2 may extend in the y-direction and may be electrically connected to the pixel circuits PC arranged in the same column.

The first data line DL1 and the second data line DL2 may be spaced apart from each other with the second display area DA2 therebetween. The first data line DL1 and the second data line DL2 may be electrically connected by a data connection line DWL, and the same signal may be applied to pixel circuits configured to drive the pixels PX1 arranged in the same column. The data connection line DWL may bypass the component area CA or the second display area DA2. The data connection line DWL may overlap the pixel circuits PC arranged in the first display area DA1 in a plan view. In this case, as illustrated in FIG. 13, the data connection line DWL may pass through the first display area DA1 arranged outside the second display area DA2. In another embodiment, although not illustrated in FIG. 13, the data connection line DWL may also be arranged in the second display area DA2 to bypass the component area CA. The data connection line DWL may be arranged on a different layer from the first data line DL1 and the second data line DL2 and may be electrically connected to the first data line DL1 and the second data line DL2 through a contact hole.

In another embodiment, the first data line DL1 and the second data line DL2 may also be electrically connected (e.g., directly connected) to each other. In this case, the first data line DL1 and the second data line DL2 may pass through the second display area DA2, and may not overlap the component area CA in a plan view. Thus, the first data line DL1 and the second data line DL2 may be formed as one body and may include a conductive transparent layer like the connection line CWL.

The display panel 10 as described above may be used as the display panel 10 of the display device 1 illustrated in one of FIGS. 2A to 2D and FIGS. 3A to 3C. In this case, the display panel 10 may include the encapsulation substrate 300a or the thin-film encapsulation layer 300b, similar to the display panel 10 of the display device 1 illustrated in one of FIGS. 2A to 2D and FIGS. 3A to 3C. Although not illustrated in the drawing, the display panel 10 may include a through hole 10H, 100H, 200H, 300H, or the like (e.g., refer to FIGS. 2A to 2D and FIGS. 3A to 3C) of the display panel 10 of the display device 1 illustrated in one of FIGS. 2A to 2D and FIGS. 3A to 3C. In other embodiments, the display panel 10 may not include a through hole. Thus, the display panel 10 may include only a minimum amount of material in the component area CA in which a component is arranged.

Figure 14A:
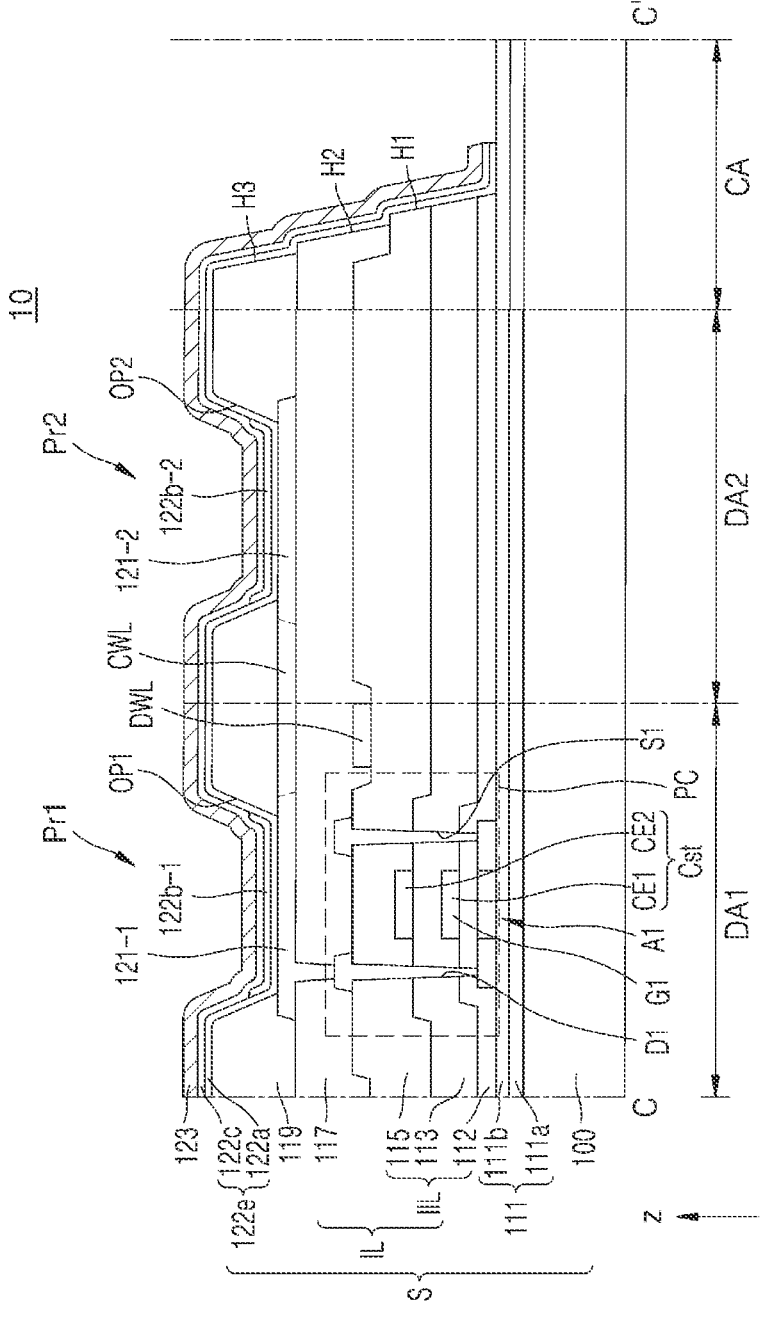
FIGS. 14A and 14B are schematic cross-sectional views of the display panel taken along line C-C' of FIG. 13.

FIG. 14A is a schematic cross-sectional view of the display panel taken along line C-C' of FIG. 13.

Referring to FIG. 14A, the display panel 10 may include the display substrate S illustrated in FIGS. 10A to 10C. In another embodiment, the display panel 10 may also include the display substrate S and the capping layer 124 illustrated in FIG. 11. For convenience of description, a case in which the display panel 10 includes the display substrate S illustrated in FIGS. 10A to 10C will be mainly described in detail.

The display substrate S may include a red pixel Pr1 in which a red first display element is arranged, and a red auxiliary pixel Pr2 in which a red second display element is arranged. In the red pixel Pr1, an emission area may be defined by a first opening OP1. In the red auxiliary pixel Pr2, an emission area may be defined by a second opening OP2. The red pixel Pr1 may emit red light by an organic light-emitting layer 122b-1 arranged on a pixel electrode 121-1, and the red auxiliary pixel Pr2 may emit red light by an auxiliary organic light-emitting layer 122b-2 arranged on an auxiliary pixel electrode 121-2. In this case, the organic light-emitting layer 122b-1 and the auxiliary organic light-emitting layer 122b-2 may be formed of (or include) a same material.

The red pixel Pr1 as described above may include a functional layer 122e including the same organic material as the red auxiliary pixel Pr2. In this case, the functional layer 122e may include at least one of the first functional layer 122a and the second functional layer 122c. Each of the functional layer 122e as described above and the opposite electrode 123 may include an opening area corresponding to the component area CA. For example, the functional layer 122e may include a first opening area corresponding to the component area CA, and the opposite electrode 123 may include a second opening area corresponding to the component area CA. In this case, the first opening area and the second opening area may have the same or similar widths. For example, the first opening area and the second opening area may have the same planar shape as the component area CA illustrated in FIG. 13. For example, the first opening area and the second opening area may have the same planar shape as the component area CA and may be disposed in the component area CA. For convenience of description, which the first opening area and the second opening area have the same planar shape as the component area CA illustrated in FIG. 13 will be mainly described in detail.

Although not illustrated in the drawing, the display substrate S as described above may include a green pixel, a blue pixel, a green auxiliary pixel, and a blue auxiliary pixel.

However, hereinafter, for convenience of description, the red pixel Pr1 and the red auxiliary pixel Pr2 will be mainly described in detail.

The display panel 10 as described above may include a connection line CWL electrically connecting the red pixel Pr1 to the red auxiliary pixel Pr2. In this regard, the connection line CWL may electrically connect the pixel electrode 121-1 of the red pixel Pr1 to the auxiliary pixel electrode 121-2 of the red auxiliary pixel Pr2. In this case, the connection line CWL may be arranged on the same layer as the pixel electrode 121-1 and the auxiliary pixel electrode 121-2. Thus, the connection line CWL may be formed as one body with at least one of the pixel electrode 121-1 and the auxiliary pixel electrode 121-2.

In case that the connection line CWL is arranged as described above, in a case in which the pixel circuit PC operates to operate the red pixel Pr1, the red auxiliary pixel Pr2 may also simultaneously operate. In the aforementioned case, the red pixel Pr1 arranged in the first display area DA1 and the red auxiliary pixel Pr2 arranged in the second display area DA2 simultaneously operate, so that an image may be smoothly implemented in a border area of the component area CA.

Although not illustrated in the drawing, the display substrate S may include a green pixel, a blue pixel, a green auxiliary pixel, and a blue auxiliary pixel. In this case, a green pixel of the first display area DA1 and a green auxiliary pixel of the second display area DA2, which are arranged adjacent to each other, may be electrically connected by another connection line, and a blue pixel of the first display area DA1 and a blue auxiliary pixel of the second display area DA2, which are arranged adjacent to each other, may be electrically connected by another connection line.

In case that a hole is formed in the substrate 100 and various layers arranged on the substrate 100 as in FIGS. 2A, 2B, 3A, 3B, and 3C, a hole may be formed in the substrate 100 after the encapsulation substrate 300a or the thin-film encapsulation layer 300b is formed, or the encapsulation substrate 300a or the thin-film encapsulation layer 300b may be formed after a hole is formed in the substrate 100.

Figure 14B:
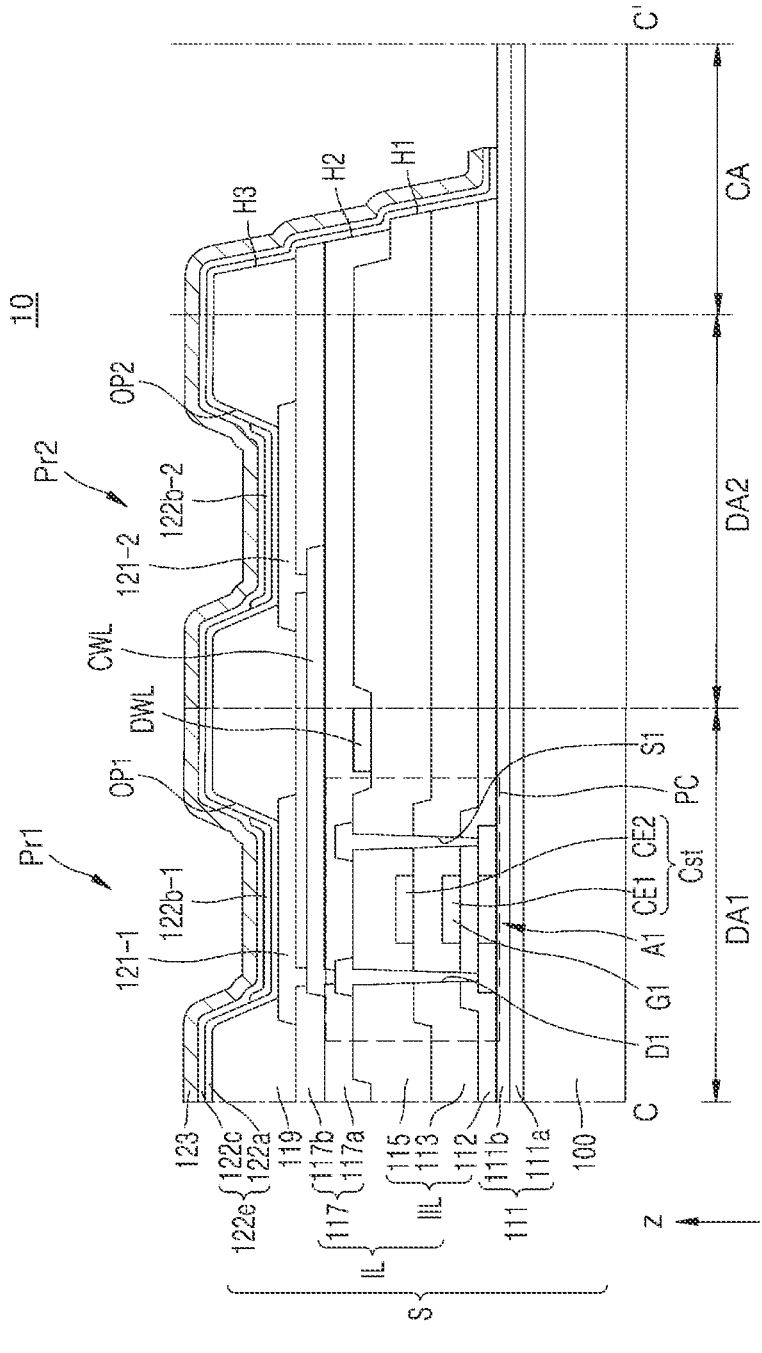

FIG. 14B is a schematic cross-sectional view of the display panel taken along line C-C' of FIG. 13.

Referring to FIG. 14B, the display panel 10 may include the display substrate S illustrated in FIGS. 10A to 10C. In another embodiment, the display panel 10 may also include the display substrate S and the capping layer 124 illustrated in FIG. 11. For convenience of description, a case in which the display panel 10 includes the display substrate S illustrated in FIGS. 10A to 10C will be mainly described in detail. Also, hereinafter, for convenience of description, differences from FIG. 14A will be mainly described in detail.

The display substrate S as described above may include multiple planarization layers 117. For example, the planarization layers 117 may include a first planarization layer 117a and a second planarization layer 117b. The first planarization layer 117a as described above may cover (or overlap in a plan view) a source electrode S1 and a drain electrode D1. The second planarization layer 117b may cover the first planarization layer 117a.

A connection line CWL electrically connecting one of the source electrode S1 and the drain electrode D1 to a pixel electrode 121-1 may be disposed between the first planarization layer 117a and the second planarization layer 117b. In this case, the connection line CWL may be electrically connected to an auxiliary pixel electrode 121-2.

The connection line CWL may be electrically connected to a pixel PX1 and an auxiliary pixel PX2, and may be electrically connected to the pixel circuit PC. In this case, in case that the pixel PX1 operates, the auxiliary pixel PX2 may simultaneously operate. For example, in case that the pixel PX1 is operated by the pixel circuit PC to emit light of a color, the auxiliary pixel PX2 may also simultaneously operate to emit light of the same color.

Although not illustrated in the drawing, the display substrate S may include a green pixel, a blue pixel, a green auxiliary pixel, and a blue auxiliary pixel. In this case, a green pixel of the first display area DA1 and a green auxiliary pixel of the second display area DA2, which are arranged adjacent to each other, may be electrically connected by another connection line, and a blue pixel of the first display area DA1 and a blue auxiliary pixel of the second display area DA2, which are arranged adjacent to each other, may be electrically connected by another connection line.

In case that a hole is formed in the substrate 100 and various layers arranged on the substrate 100 as in FIGS. 2A, 2B, 3A, 3B, and 3C, a hole may be formed in the substrate 100 after the encapsulation substrate 300*a* or the thin-film encapsulation layer 300*b* is formed, or the encapsulation substrate 300*a* or the thin-film encapsulation layer 300*b* may be formed after a hole is formed in the substrate 100.

The apparatus for manufacturing the display device and the method of manufacturing the display device according to the one or more embodiments may safely and precisely remove some layers of the display device.

The apparatus for manufacturing the display device and the method of manufacturing the display device according to the one or more embodiments may significantly remove or prevent damage to an organic light-emitting element in case that some layers of the display device are removed.

According to the one or more embodiments, a soft image may be implemented in a space between a transmission area and a first display area of the display device.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope of the disclosure.

What is claimed is:

1. A display device comprising:
a first display area;
a second display area;
a transmission area arranged inside the second display area
a pixel circuit arranged in the first display area;
a pixel arranged in the first display area and electrically connected to the pixel circuit;
an auxiliary pixel arranged in the second display area, electrically connected to the pixel circuit, and emitting light of a same color as the pixel; and
a connection line electrically connecting the auxiliary pixel to the pixel circuit, wherein each of the pixel and the auxiliary pixel includes:
a pixel electrode;
an intermediate layer arranged on the pixel electrode and including an organic light-emitting layer;
an opposite electrode arranged on the intermediate layer; and
a functional layer including an organic material,
the functional layer includes a first opening corresponding to the transmission area, and
the opposite electrode includes a second opening corresponding to the transmission area.

2. The display device of claim 1, further comprising:
a component arranged in the transmission area.

3. The display device of claim 2, wherein the component is a sensor, a camera, a lamp, or a speaker.

4. The display device of claim 1, wherein the function layer is arranged above or under the organic light-emitting layer.

5. The display device of claim 4, wherein the functional layer comprises a hole transport layer or an electron transport layer.

6. The display device of claim 1, wherein the transmission area does not contain pixels.

* * * * *